(12) United States Patent
Rosenband et al.

(10) Patent No.: US 8,397,013 B1
(45) Date of Patent: Mar. 12, 2013

(54) HYBRID MEMORY MODULE

(75) Inventors: Daniel L. Rosenband, San Mateo, CA (US); Frederick Daniel Weber, San Jose, CA (US); Michael John Sebastian Smith, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 697 days.

(21) Appl. No.: 12/057,306

(22) Filed: Mar. 27, 2008

Related U.S. Application Data

(63) Continuation-in-part of application No. 11/611,374, filed on Dec. 15, 2006, now Pat. No. 8,055,833.

(60) Provisional application No. 60/849,631, filed on Oct. 5, 2006.

(51) Int. Cl.
*G06F 12/00* (2006.01)
*G11C 7/00* (2006.01)

(52) U.S. Cl. ........ 711/103; 711/104; 711/105; 711/111; 711/148; 711/154; 365/205

(58) Field of Classification Search .................. 711/102, 711/103, 104, 105, 111, 148, 154; 365/205
See application file for complete search history.

(56) References Cited

U.S. PATENT DOCUMENTS

| | | |
|---|---|---|
| 3,800,292 A | 3/1974 | Curley et al. |
| 4,069,452 A | 1/1978 | Conway et al. |
| 4,323,965 A | 4/1982 | Johnson et al. |
| 4,334,307 A | 6/1982 | Bourgeois et al. |
| 4,345,319 A | 8/1982 | Bernardini et al. |
| 4,392,212 A | 7/1983 | Miyasaka et al. ............. 365/230 |
| 4,525,921 A | 7/1985 | Carson et al. |
| 4,566,082 A | 1/1986 | Anderson |
| 4,592,019 A | 5/1986 | Huang et al. |
| 4,646,128 A | 2/1987 | Carson et al. |
| 4,698,748 A | 10/1987 | Juzswik et al. |
| 4,706,166 A | 11/1987 | Go |
| 4,710,903 A | 12/1987 | Hereth et al. |
| 4,764,846 A | 8/1988 | Go |
| 4,780,843 A | 10/1988 | Tietjen |
| 4,794,597 A | 12/1988 | Ooba et al. |
| 4,796,232 A | 1/1989 | House ........................... 365/189 |
| 4,807,191 A | 2/1989 | Flannagan |
| 4,841,440 A | 6/1989 | Yonezu et al. |
| 4,862,347 A | 8/1989 | Rudy |

(Continued)

FOREIGN PATENT DOCUMENTS

| | | |
|---|---|---|
| DE | 102004051345 | 5/2006 |
| DE | 102004053316 | 5/2006 |

(Continued)

OTHER PUBLICATIONS

Non-final Office Action from U.S. Appl. No. 11/939,432 mailed on Feb. 19, 2009.

(Continued)

*Primary Examiner* — Mardochee Chery
(74) *Attorney, Agent, or Firm* — Fish & Richardson P.C.

(57) ABSTRACT

One embodiment of the present invention sets forth a hybrid memory module that combines memory devices of different types while presenting a single technology interface. The hybrid memory module includes a number of super-stacks and a first interface configured to transmit data between the super-stacks and a memory controller. Each super-stack includes a number of sub-stacks, a super-controller configured to control the sub-stacks, and a second interface configured to transmit data between the sub-stacks and the first interface. Combining memory devices of different types allows utilizing the favorable properties of each type of the memory devices, while hiding their unfavorable properties from the memory controller.

36 Claims, 11 Drawing Sheets

U.S. PATENT DOCUMENTS

| | | |
|---|---|---|
| 4,884,237 A | 11/1989 | Mueller et al. |
| 4,887,240 A | 12/1989 | Garverick et al. ............ 361/222 |
| 4,888,687 A | 12/1989 | Allison et al. |
| 4,899,107 A | 2/1990 | Corbett et al. |
| 4,912,678 A | 3/1990 | Mashiko |
| 4,922,451 A | 5/1990 | Lo et al. |
| 4,935,734 A | 6/1990 | Austin |
| 4,937,791 A | 6/1990 | Steele et al. |
| 4,956,694 A | 9/1990 | Eide |
| 4,982,265 A | 1/1991 | Watanabe et al. |
| 4,983,533 A | 1/1991 | Go |
| 5,025,364 A | 6/1991 | Zellmer |
| 5,072,424 A | 12/1991 | Brent et al. ................... 365/189 |
| 5,083,266 A | 1/1992 | Watanabe |
| 5,104,820 A | 4/1992 | Go et al. |
| 5,193,072 A | 3/1993 | Frenkil et al. |
| 5,212,666 A | 5/1993 | Takeda |
| 5,220,672 A | 6/1993 | Nakao et al. |
| 5,241,266 A | 8/1993 | Ahmad et al. |
| 5,252,807 A | 10/1993 | Chizinsky |
| 5,257,233 A | 10/1993 | Schaefer |
| 5,278,796 A | 1/1994 | Tillinghast et al. |
| 5,282,177 A | 1/1994 | McLaury |
| 5,332,922 A | 7/1994 | Oguchi et al. ................ 257/723 |
| 5,347,428 A | 9/1994 | Carson et al. |
| 5,369,749 A | 11/1994 | Baker et al. |
| 5,384,745 A | 1/1995 | Konishi et al. |
| 5,388,265 A | 2/1995 | Volk |
| 5,390,334 A | 2/1995 | Harrison |
| 5,408,190 A | 4/1995 | Wood et al. |
| 5,432,729 A | 7/1995 | Carson et al. |
| 5,448,511 A | 9/1995 | Paurus et al. |
| 5,467,455 A | 11/1995 | Gay et al. |
| 5,483,497 A | 1/1996 | Mochizuki et al. |
| 5,498,886 A | 3/1996 | Hsu et al. ..................... 257/213 |
| 5,502,333 A | 3/1996 | Bertin et al. |
| 5,502,667 A | 3/1996 | Bertin et al. |
| 5,513,135 A | 4/1996 | Dell et al. |
| 5,513,339 A | 4/1996 | Agrawal et al. |
| 5,519,832 A | 5/1996 | Warchol |
| 5,526,320 A | 6/1996 | Zagar et al. |
| 5,530,836 A | 6/1996 | Busch et al. |
| 5,559,990 A | 9/1996 | Cheng et al. |
| 5,561,622 A | 10/1996 | Bertin et al. |
| 5,563,086 A | 10/1996 | Bertin et al. |
| 5,566,344 A | 10/1996 | Hall et al. |
| 5,581,498 A | 12/1996 | Ludwig et al. |
| 5,581,779 A | 12/1996 | Hall et al. |
| 5,590,071 A | 12/1996 | Kolor et al. |
| 5,598,376 A | 1/1997 | Merritt et al. |
| 5,604,714 A | 2/1997 | Manning et al. |
| 5,606,710 A | 2/1997 | Hall et al. |
| 5,608,262 A | 3/1997 | Degani et al. |
| 5,610,864 A | 3/1997 | Manning |
| 5,623,686 A | 4/1997 | Hall et al. |
| 5,627,791 A | 5/1997 | Wright et al. |
| 5,640,337 A | 6/1997 | Huang et al. |
| 5,640,364 A | 6/1997 | Merritt et al. |
| 5,652,724 A | 7/1997 | Manning |
| 5,654,204 A | 8/1997 | Anderson |
| 5,661,677 A | 8/1997 | Rondeau et al. |
| 5,661,695 A | 8/1997 | Zagar et al. |
| 5,668,773 A | 9/1997 | Zagar et al. |
| 5,675,549 A | 10/1997 | Ong et al. |
| 5,680,342 A | 10/1997 | Frankeny |
| 5,682,354 A | 10/1997 | Manning |
| 5,692,121 A | 11/1997 | Bozso et al. |
| 5,692,202 A | 11/1997 | Kardach et al. |
| 5,696,732 A | 12/1997 | Zagar et al. |
| 5,702,984 A | 12/1997 | Bertin et al. |
| 5,703,813 A | 12/1997 | Manning et al. |
| 5,706,247 A | 1/1998 | Merritt et al. |
| RE35,733 E | 2/1998 | Hernandez et al. |
| 5,717,654 A | 2/1998 | Manning |
| 5,721,859 A | 2/1998 | Manning |
| 5,724,288 A | 3/1998 | Cloud et al. |
| 5,729,503 A | 3/1998 | Manning |
| 5,729,504 A | 3/1998 | Cowles ........................ 365/236 |
| 5,742,792 A | 4/1998 | Yanai et al. |
| 5,748,914 A | 5/1998 | Barth et al. |
| 5,752,045 A | 5/1998 | Chen |
| 5,757,703 A | 5/1998 | Merritt et al. |
| 5,761,703 A | 6/1998 | Bolyn ........................... 711/106 |
| 5,781,766 A | 7/1998 | Davis |
| 5,787,457 A | 7/1998 | Miller et al. |
| 5,798,961 A | 8/1998 | Heyden et al. |
| 5,802,010 A | 9/1998 | Zagar et al. |
| 5,802,395 A | 9/1998 | Connolly et al. |
| 5,802,555 A | 9/1998 | Shigeeda ...................... 711/106 |
| 5,812,488 A | 9/1998 | Zagar et al. |
| 5,818,788 A | 10/1998 | Kimura et al. |
| 5,819,065 A | 10/1998 | Chilton et al. |
| 5,831,833 A | 11/1998 | Shirakawa et al. |
| 5,831,931 A | 11/1998 | Manning |
| 5,831,932 A | 11/1998 | Merritt et al. |
| 5,834,838 A | 11/1998 | Anderson |
| 5,835,435 A | 11/1998 | Bogin et al. |
| 5,838,165 A | 11/1998 | Chatter |
| 5,838,177 A | 11/1998 | Keeth |
| 5,841,580 A | 11/1998 | Farmwald et al. ............. 365/194 |
| 5,843,799 A | 12/1998 | Hsu et al. .......................... 438/6 |
| 5,843,807 A | 12/1998 | Burns |
| 5,845,108 A | 12/1998 | Yoo et al. |
| 5,850,368 A | 12/1998 | Ong et al. |
| 5,859,792 A | 1/1999 | Rondeau et al. |
| 5,860,106 A | 1/1999 | Domen et al. |
| 5,870,347 A | 2/1999 | Keeth et al. |
| 5,870,350 A | 2/1999 | Bertin et al. |
| 5,872,907 A | 2/1999 | Griess et al. |
| 5,875,142 A | 2/1999 | Chevallier |
| 5,878,279 A | 3/1999 | Athenes |
| 5,884,088 A | 3/1999 | Kardach et al. |
| 5,901,105 A | 5/1999 | Ong et al. |
| 5,903,500 A | 5/1999 | Tsang et al. |
| 5,905,688 A | 5/1999 | Park |
| 5,907,512 A | 5/1999 | Parkinson et al. |
| 5,913,072 A | 6/1999 | Wierenga |
| 5,915,105 A | 6/1999 | Farmwald et al. |
| 5,915,167 A | 6/1999 | Leedy |
| 5,917,758 A | 6/1999 | Keeth |
| 5,923,611 A | 7/1999 | Ryan |
| 5,924,111 A | 7/1999 | Huang et al. |
| 5,926,435 A | 7/1999 | Park et al. |
| 5,929,650 A | 7/1999 | Pappert et al. |
| 5,943,254 A | 8/1999 | Bakeman, Jr. et al. |
| 5,946,265 A | 8/1999 | Cowles |
| 5,949,254 A | 9/1999 | Keeth |
| 5,953,215 A | 9/1999 | Karabatsos |
| 5,953,263 A | 9/1999 | Farmwald et al. |
| 5,954,804 A | 9/1999 | Farmwald et al. |
| 5,956,233 A | 9/1999 | Yew et al. |
| 5,963,429 A | 10/1999 | Chen |
| 5,963,463 A | 10/1999 | Rondeau et al. |
| 5,963,464 A | 10/1999 | Dell et al. |
| 5,963,504 A | 10/1999 | Manning |
| 5,966,724 A | 10/1999 | Ryan |
| 5,966,727 A | 10/1999 | Nishino |
| 5,969,996 A | 10/1999 | Muranaka et al. ............ 365/189 |
| 5,973,392 A | 10/1999 | Senba et al. |
| 5,995,424 A | 11/1999 | Lawrence et al. |
| 5,995,443 A | 11/1999 | Farmwald et al. |
| 6,001,671 A | 12/1999 | Fjelstad |
| 6,002,613 A | 12/1999 | Cloud et al. |
| 6,002,627 A | 12/1999 | Chevallier |
| 6,014,339 A | 1/2000 | Kobayashi et al. |
| 6,016,282 A | 1/2000 | Keeth |
| 6,026,050 A | 2/2000 | Baker et al. .................. 365/233 |
| 6,029,250 A | 2/2000 | Keeth ........................... 713/400 |
| 6,032,214 A | 2/2000 | Farmwald et al. |
| 6,032,215 A | 2/2000 | Farmwald et al. |
| 6,034,916 A | 3/2000 | Lee |
| 6,034,918 A | 3/2000 | Farmwald et al. |
| 6,035,365 A | 3/2000 | Farmwald et al. |
| 6,038,195 A | 3/2000 | Farmwald et al. |
| 6,038,673 A | 3/2000 | Benn et al. |
| 6,044,032 A | 3/2000 | Li |
| 6,047,073 A | 4/2000 | Norris et al. |

| Patent No. | Kind | Date | Inventor | Class |
|---|---|---|---|---|
| 6,047,344 | A | 4/2000 | Kawasumi et al. | |
| 6,053,948 | A | 4/2000 | Vaidyanathan et al. | 703/14 |
| 6,058,451 | A | 5/2000 | Bermingham et al. | |
| 6,065,092 | A | 5/2000 | Roy | |
| 6,069,504 | A | 5/2000 | Keeth | |
| 6,070,217 | A | 5/2000 | Connolly et al. | |
| 6,073,223 | A | 6/2000 | McAllister et al. | |
| 6,075,730 | A | 6/2000 | Barth et al. | |
| 6,075,744 | A | 6/2000 | Tsern et al. | 365/230 |
| 6,078,546 | A | 6/2000 | Lee | |
| 6,079,025 | A | 6/2000 | Fung | |
| 6,084,434 | A | 7/2000 | Keeth | |
| 6,088,290 | A | 7/2000 | Ohtake et al. | |
| 6,091,251 | A | 7/2000 | Wood et al. | |
| RE36,839 | E | 8/2000 | Simmons et al. | |
| 6,101,152 | A | 8/2000 | Farmwald et al. | |
| 6,101,564 | A | 8/2000 | Athenes et al. | |
| 6,101,612 | A | 8/2000 | Jeddeloh | |
| 6,108,795 | A | 8/2000 | Jeddeloh | |
| 6,111,812 | A | 8/2000 | Gans et al. | 365/233 |
| 6,125,072 | A | 9/2000 | Wu | |
| 6,134,638 | A | 10/2000 | Olarig et al. | 711/167 |
| 6,154,370 | A | 11/2000 | Degani et al. | |
| 6,166,991 | A | 12/2000 | Phelan | |
| 6,181,640 | B1 | 1/2001 | Kang | |
| 6,182,184 | B1 | 1/2001 | Farmwald et al. | |
| 6,199,151 | B1 | 3/2001 | Williams et al. | |
| 6,208,168 | B1 | 3/2001 | Rhee | |
| 6,216,246 | B1 | 4/2001 | Shau | 714/763 |
| 6,222,739 | B1 | 4/2001 | Bhakta et al. | |
| 6,226,709 | B1 | 5/2001 | Goodwin et al. | |
| 6,226,730 | B1 | 5/2001 | Murdoch et al. | |
| 6,233,192 | B1 | 5/2001 | Tanaka | |
| 6,233,650 | B1 | 5/2001 | Johnson et al. | |
| 6,240,048 | B1 | 5/2001 | Matsubara | |
| 6,243,282 | B1 | 6/2001 | Rondeau et al. | |
| 6,252,807 | B1 | 6/2001 | Suzuki et al. | |
| 6,260,097 | B1 | 7/2001 | Farmwald et al. | |
| 6,260,154 | B1 | 7/2001 | Jeddeloh | |
| 6,262,938 | B1 | 7/2001 | Lee et al. | |
| 6,266,285 | B1 | 7/2001 | Farmwald et al. | |
| 6,266,292 | B1 | 7/2001 | Tsern et al. | 365/230 |
| 6,274,395 | B1 | 8/2001 | Weber | |
| 6,279,069 | B1 | 8/2001 | Robinson et al. | 711/103 |
| 6,295,572 | B1 | 9/2001 | Wu | |
| 6,298,426 | B1 | 10/2001 | Ajanovic | |
| 6,304,511 | B1 | 10/2001 | Gans et al. | 365/233 |
| 6,307,769 | B1 | 10/2001 | Nuxoll et al. | |
| 6,314,051 | B1 | 11/2001 | Farmwald et al. | |
| 6,317,352 | B1 | 11/2001 | Halbert et al. | 365/52 |
| 6,317,381 | B1 | 11/2001 | Gans et al. | 365/233 |
| 6,324,120 | B2 | 11/2001 | Farmwald et al. | |
| 6,326,810 | B1 | 12/2001 | Keeth | |
| 6,327,664 | B1 | 12/2001 | Dell et al. | |
| 6,330,683 | B1 | 12/2001 | Jeddeloh | |
| 6,336,174 | B1 | 1/2002 | Li et al. | |
| 6,338,108 | B1 | 1/2002 | Motomura | |
| 6,338,113 | B1 | 1/2002 | Kubo et al. | |
| 6,341,347 | B1 | 1/2002 | Joy et al. | 712/228 |
| 6,343,019 | B1 | 1/2002 | Jiang et al. | |
| 6,343,042 | B1 | 1/2002 | Tsern et al. | 365/222 |
| 6,353,561 | B1 | 3/2002 | Funyu et al. | |
| 6,356,105 | B1 | 3/2002 | Volk | |
| 6,356,500 | B1 | 3/2002 | Cloud et al. | |
| 6,362,656 | B2 | 3/2002 | Rhee | |
| 6,363,031 | B2 | 3/2002 | Phelan | |
| 6,378,020 | B2 | 4/2002 | Farmwald et al. | |
| 6,381,188 | B1 | 4/2002 | Choi et al. | |
| 6,381,668 | B1 | 4/2002 | Lunteren | |
| 6,389,514 | B1 | 5/2002 | Rokicki | |
| 6,392,304 | B1 | 5/2002 | Butler | |
| 6,414,868 | B1 | 7/2002 | Wong et al. | 365/51 |
| 6,418,034 | B1 | 7/2002 | Weber et al. | |
| 6,421,754 | B1 | 7/2002 | Kau et al. | |
| 6,424,532 | B2 | 7/2002 | Kawamura | |
| 6,426,916 | B2 | 7/2002 | Farmwald et al. | |
| 6,429,029 | B1 | 8/2002 | Eldridge et al. | |
| 6,430,103 | B2 | 8/2002 | Nakayama et al. | |
| 6,437,600 | B1 | 8/2002 | Keeth | |
| 6,438,057 | B1 | 8/2002 | Ruckerbauer | |
| 6,442,698 | B2 | 8/2002 | Nizar | |
| 6,445,591 | B1 | 9/2002 | Kwong | |
| 6,452,826 | B1 | 9/2002 | Kim et al. | |
| 6,452,863 | B2 | 9/2002 | Farmwald et al. | |
| 6,453,400 | B1 | 9/2002 | Maesako et al. | |
| 6,453,402 | B1 | 9/2002 | Jeddeloh | 711/167 |
| 6,453,434 | B2 | 9/2002 | Delp et al. | |
| 6,455,348 | B1 | 9/2002 | Yamaguchi | |
| 6,457,095 | B1 | 9/2002 | Volk | |
| 6,459,651 | B1 | 10/2002 | Lee et al. | |
| 6,473,831 | B1 | 10/2002 | Schade | |
| 6,480,929 | B1 | 11/2002 | Gauthier et al. | |
| 6,487,102 | B1 | 11/2002 | Halbert et al. | |
| 6,489,669 | B2 | 12/2002 | Shimada et al. | |
| 6,490,161 | B1 | 12/2002 | Johnson | |
| 6,492,726 | B1 | 12/2002 | Quek et al. | |
| 6,493,789 | B2 | 12/2002 | Ware et al. | |
| 6,496,440 | B2 | 12/2002 | Manning | |
| 6,496,897 | B2 | 12/2002 | Ware et al. | |
| 6,498,766 | B2 | 12/2002 | Lee et al. | 365/233 |
| 6,510,097 | B2 | 1/2003 | Fukuyama | |
| 6,510,503 | B2 | 1/2003 | Gillingham et al. | |
| 6,512,392 | B2 | 1/2003 | Fleury et al. | |
| 6,521,984 | B2 | 2/2003 | Matsuura | |
| 6,526,471 | B1 | 2/2003 | Shimomura et al. | |
| 6,526,473 | B1 | 2/2003 | Kim | |
| 6,526,484 | B1 | 2/2003 | Stacovsky et al. | |
| 6,545,895 | B1 | 4/2003 | Li et al. | |
| 6,546,446 | B2 | 4/2003 | Farmwald et al. | |
| 6,553,450 | B1 | 4/2003 | Dodd et al. | |
| 6,560,158 | B2 | 5/2003 | Choi et al. | |
| 6,563,337 | B2 | 5/2003 | Dour | |
| 6,563,759 | B2 | 5/2003 | Yahata et al. | |
| 6,564,281 | B2 | 5/2003 | Farmwald et al. | |
| 6,564,285 | B1 | 5/2003 | Mills et al. | 711/103 |
| 6,574,150 | B2 | 6/2003 | Suyama et al. | |
| 6,584,037 | B2 | 6/2003 | Farmwald et al. | |
| 6,587,912 | B2 | 7/2003 | Leddige et al. | |
| 6,590,822 | B2 | 7/2003 | Hwang et al. | |
| 6,594,770 | B1 | 7/2003 | Sato et al. | |
| 6,597,616 | B2 | 7/2003 | Tsern et al. | 365/222 |
| 6,597,617 | B2 | 7/2003 | Ooishi et al. | |
| 6,614,700 | B2 | 9/2003 | Dietrich et al. | |
| 6,618,267 | B1 | 9/2003 | Dalal et al. | |
| 6,618,791 | B1 | 9/2003 | Dodd et al. | |
| 6,621,760 | B1 | 9/2003 | Ahmad et al. | |
| 6,628,538 | B2 | 9/2003 | Funaba et al. | |
| 6,630,729 | B2 | 10/2003 | Huang | |
| 6,631,086 | B1 | 10/2003 | Bill et al. | |
| 6,639,820 | B1 | 10/2003 | Khandekar et al. | |
| 6,646,939 | B2 | 11/2003 | Kwak | |
| 6,650,588 | B2 | 11/2003 | Yamagata | 365/222 |
| 6,650,594 | B1 | 11/2003 | Lee et al. | |
| 6,657,634 | B1 | 12/2003 | Sinclair et al. | |
| 6,657,918 | B2 | 12/2003 | Foss et al. | |
| 6,657,919 | B2 | 12/2003 | Foss et al. | |
| 6,658,016 | B1 | 12/2003 | Dai et al. | |
| 6,658,530 | B1 | 12/2003 | Robertson et al. | |
| 6,664,625 | B2 | 12/2003 | Hiruma | |
| 6,665,224 | B1 | 12/2003 | Lehmann et al. | |
| 6,665,227 | B2 | 12/2003 | Fetzer | |
| 6,668,242 | B1 | 12/2003 | Reynov et al. | |
| 6,674,154 | B2 | 1/2004 | Minamio et al. | |
| 6,683,372 | B1 | 1/2004 | Wong et al. | |
| 6,684,292 | B2 | 1/2004 | Piccirillo et al. | |
| 6,690,191 | B2 | 2/2004 | Wu et al. | |
| 6,697,295 | B2 | 2/2004 | Farmwald et al. | |
| 6,701,446 | B2 | 3/2004 | Tsern et al. | |
| 6,705,877 | B1 | 3/2004 | Li et al. | |
| 6,708,144 | B1 | 3/2004 | Merryman et al. | |
| 6,710,430 | B2 | 3/2004 | Minamio et al. | |
| 6,713,856 | B2 | 3/2004 | Tsai et al. | |
| 6,714,891 | B2 | 3/2004 | Dendinger | |
| 6,724,684 | B2 | 4/2004 | Kim | |
| 6,730,540 | B2 | 5/2004 | Siniaguine | |
| 6,731,009 | B1 | 5/2004 | Jones et al. | |
| 6,731,527 | B2 | 5/2004 | Brown | 365/63 |
| 6,742,098 | B1 | 5/2004 | Halbert et al. | |

| | | |
|---|---|---|
| 6,744,687 B2 | 6/2004 | Koo et al. |
| 6,747,887 B2 | 6/2004 | Halbert et al. |
| 6,751,113 B2 | 6/2004 | Bhakta et al. |
| 6,751,696 B2 | 6/2004 | Farmwald et al. |
| 6,754,129 B2 | 6/2004 | Khatri et al. |
| 6,754,132 B2 | 6/2004 | Kyung |
| 6,757,751 B1 | 6/2004 | Gene |
| 6,762,948 B2 | 7/2004 | Kyun et al. |
| 6,765,812 B2 | 7/2004 | Anderson |
| 6,766,469 B2 | 7/2004 | Larson et al. |
| 6,771,526 B2 | 8/2004 | LaBerge |
| 6,772,359 B2 | 8/2004 | Kwak et al. |
| 6,779,097 B2 | 8/2004 | Gillingham et al. |
| 6,785,767 B2 | 8/2004 | Coulson |
| 6,791,877 B2 | 9/2004 | Miura et al. |
| 6,795,899 B2 | 9/2004 | Dodd et al. |
| 6,799,241 B2 | 9/2004 | Kahn et al. |
| 6,801,989 B2 | 10/2004 | Johnson et al. ............... 711/167 |
| 6,807,598 B2 | 10/2004 | Farmwald et al. |
| 6,807,655 B1 | 10/2004 | Rehani et al. |
| 6,816,991 B2 | 11/2004 | Sanghani |
| 6,819,602 B2 | 11/2004 | Seo et al. |
| 6,819,617 B2 | 11/2004 | Hwang et al. |
| 6,820,163 B1 | 11/2004 | McCall et al. |
| 6,820,169 B2 | 11/2004 | Wilcox et al. |
| 6,826,104 B2 | 11/2004 | Kawaguchi et al. |
| 6,839,290 B2 | 1/2005 | Ahmad et al. |
| 6,845,027 B2 | 1/2005 | Mayer et al. |
| 6,845,055 B1 | 1/2005 | Koga et al. |
| 6,847,582 B2 | 1/2005 | Pan |
| 6,850,449 B2 | 2/2005 | Takahashi |
| 6,862,202 B2 | 3/2005 | Schaefer |
| 6,862,249 B2 | 3/2005 | Kyung |
| 6,862,653 B1 | 3/2005 | Dodd et al. |
| 6,873,534 B2 | 3/2005 | Bhakta et al. |
| 6,878,570 B2 | 4/2005 | Lyu et al. |
| 6,894,933 B2 | 5/2005 | Kuzmenka et al. |
| 6,898,683 B2 | 5/2005 | Nakamura |
| 6,908,314 B2 | 6/2005 | Brown |
| 6,912,778 B2 | 7/2005 | Ahn et al. |
| 6,914,786 B1 | 7/2005 | Paulsen et al. |
| 6,917,219 B2 | 7/2005 | New ............... 326/41 |
| 6,922,371 B2 | 7/2005 | Takahashi et al. |
| 6,930,900 B2 | 8/2005 | Bhakta et al. |
| 6,930,903 B2 | 8/2005 | Bhakta et al. |
| 6,938,119 B2 | 8/2005 | Kohn et al. |
| 6,943,450 B2 | 9/2005 | Fee et al. |
| 6,944,748 B2 | 9/2005 | Sanches et al. |
| 6,947,341 B2 | 9/2005 | Stubbs et al. |
| 6,951,982 B2 | 10/2005 | Chye et al. |
| 6,952,794 B2 | 10/2005 | Lu |
| 6,961,281 B2 | 11/2005 | Wong et al. |
| 6,968,416 B2 | 11/2005 | Moy |
| 6,968,419 B1 | 11/2005 | Holman |
| 6,970,968 B1 | 11/2005 | Holman |
| 6,980,021 B1 | 12/2005 | Srivastava et al. ............... 326/30 |
| 6,986,118 B2 | 1/2006 | Dickman |
| 6,992,501 B2 | 1/2006 | Rapport |
| 6,992,950 B2 | 1/2006 | Foss et al. |
| 7,000,062 B2 | 2/2006 | Perego et al. |
| 7,003,618 B2 | 2/2006 | Perego et al. |
| 7,003,639 B2 | 2/2006 | Tsern et al. |
| 7,007,095 B2 | 2/2006 | Chen et al. |
| 7,007,175 B2 | 2/2006 | Chang et al. |
| 7,010,642 B2 | 3/2006 | Perego et al. |
| 7,010,736 B1 | 3/2006 | Teh et al. |
| 7,024,518 B2 | 4/2006 | Halbert et al. ................. 711/115 |
| 7,026,708 B2 | 4/2006 | Cady et al. |
| 7,028,215 B2 | 4/2006 | Depew et al. |
| 7,028,234 B2 | 4/2006 | Huckaby et al. |
| 7,033,861 B1 | 4/2006 | Partridge et al. |
| 7,035,150 B2 | 4/2006 | Streif et al. |
| 7,043,599 B1 | 5/2006 | Ware et al. .................... 711/106 |
| 7,043,611 B2 | 5/2006 | McClannahan et al. |
| 7,045,396 B2 | 5/2006 | Crowley et al. |
| 7,045,901 B2 | 5/2006 | Lin et al. |
| 7,046,538 B2 | 5/2006 | Kinsley et al. |
| 7,053,470 B1 | 5/2006 | Sellers et al. |
| 7,053,478 B2 | 5/2006 | Roper et al. |
| 7,058,776 B2 | 6/2006 | Lee ............... 711/167 |
| 7,058,863 B2 | 6/2006 | Kouchi et al. |
| 7,061,784 B2 | 6/2006 | Jakobs et al. |
| 7,061,823 B2 | 6/2006 | Faue et al. |
| 7,066,741 B2 | 6/2006 | Burns et al. |
| 7,075,175 B2 | 7/2006 | Kazi et al. |
| 7,079,396 B2 | 7/2006 | Gates et al. |
| 7,079,441 B1 | 7/2006 | Partsch et al. |
| 7,079,446 B2 | 7/2006 | Murtagh et al. |
| 7,085,152 B2 | 8/2006 | Ellis et al. ..................... 365/149 |
| 7,085,941 B2 | 8/2006 | Li |
| 7,089,438 B2 | 8/2006 | Raad |
| 7,093,101 B2 | 8/2006 | Aasheim et al. |
| 7,103,730 B2 | 9/2006 | Saxena et al. |
| 7,110,322 B2 | 9/2006 | Farmwald et al. |
| 7,119,428 B2 | 10/2006 | Tanie et al. |
| 7,120,727 B2 | 10/2006 | Lee et al. ......................... 711/5 |
| 7,126,399 B1 | 10/2006 | Lee |
| 7,127,567 B2 | 10/2006 | Ramakrishnan et al. |
| 7,133,960 B1 | 11/2006 | Thompson et al. ............... 711/5 |
| 7,136,978 B2 | 11/2006 | Miura et al. |
| 7,138,823 B2 | 11/2006 | Janzen et al. |
| 7,149,145 B2 | 12/2006 | Kim et al. ...................... 365/233 |
| 7,149,824 B2 | 12/2006 | Johnson |
| 7,173,863 B2 | 2/2007 | Conley et al. |
| 7,200,021 B2 | 4/2007 | Raghuram ....................... 365/51 |
| 7,205,789 B1 | 4/2007 | Karabatsos |
| 7,210,059 B2 | 4/2007 | Jeddeloh |
| 7,215,561 B2 | 5/2007 | Park et al. |
| 7,218,566 B1 | 5/2007 | Totolos, Jr. et al. |
| 7,224,595 B2 | 5/2007 | Dreps et al. .................... 365/63 |
| 7,228,264 B2 | 6/2007 | Barrenscheen et al. |
| 7,231,562 B2 | 6/2007 | Ohlhoff et al. |
| 7,233,541 B2 | 6/2007 | Yamamoto et al. ....... 365/230.03 |
| 7,234,081 B2 | 6/2007 | Nguyen et al. |
| 7,243,185 B2 | 7/2007 | See et al. |
| 7,245,541 B2 | 7/2007 | Janzen |
| 7,254,036 B2 | 8/2007 | Pauley et al. ................. 361/721 |
| 7,266,639 B2 | 9/2007 | Raghuram ..................... 711/115 |
| 7,269,042 B2 | 9/2007 | Kinsley et al. .................. 365/52 |
| 7,269,708 B2 | 9/2007 | Ware |
| 7,274,583 B2 | 9/2007 | Park et al. |
| 7,286,436 B2 | 10/2007 | Bhakta et al. .................. 365/230 |
| 7,289,386 B2 | 10/2007 | Bhakta et al. |
| 7,296,754 B2 | 11/2007 | Nishizawa et al. ........... 235/492 |
| 7,299,330 B2 | 11/2007 | Gillingham et al. |
| 7,302,598 B2 | 11/2007 | Suzuki et al. |
| 7,307,863 B2 | 12/2007 | Yen et al. ......................... 365/63 |
| 7,317,250 B2 | 1/2008 | Koh et al. |
| 7,337,293 B2 | 2/2008 | Brittain et al. |
| 7,363,422 B2 | 4/2008 | Perego et al. .................. 711/105 |
| 7,366,947 B2 | 4/2008 | Gower et al. |
| 7,379,316 B2 | 5/2008 | Rajan |
| 7,386,656 B2 | 6/2008 | Rajan et al. |
| 7,392,338 B2 | 6/2008 | Rajan et al. |
| 7,408,393 B1 | 8/2008 | Jain et al. ...................... 327/202 |
| 7,409,492 B2 | 8/2008 | Tanaka et al. .................. 711/103 |
| 7,428,644 B2 | 9/2008 | Jeddeloh et al. |
| 7,437,579 B2 | 10/2008 | Jeddeloh et al. ............... 713/300 |
| 7,441,064 B2 | 10/2008 | Gaskins |
| 7,457,122 B2 | 11/2008 | Lai et al. |
| 7,464,225 B2 | 12/2008 | Tsern ............................. 711/115 |
| 7,472,220 B2 | 12/2008 | Rajan et al. .................... 711/103 |
| 7,474,576 B2 | 1/2009 | Co et al. |
| 7,480,147 B2 | 1/2009 | Hoss et al. |
| 7,480,774 B2 | 1/2009 | Ellis et al. |
| 7,496,777 B2 | 2/2009 | Kapil ............................. 713/324 |
| 7,515,453 B2 | 4/2009 | Rajan ............................. 365/63 |
| 7,532,537 B2 | 5/2009 | Solomon et al. ............... 365/230 |
| 7,539,800 B2 | 5/2009 | Dell et al. |
| 7,573,136 B2 | 8/2009 | Jiang et al. |
| 7,580,312 B2 | 8/2009 | Rajan et al. |
| 7,581,121 B2 | 8/2009 | Barth et al. |
| 7,581,127 B2 | 8/2009 | Rajan et al. |
| 7,590,796 B2 | 9/2009 | Rajan et al. |
| 7,599,205 B2 | 10/2009 | Rajan |
| 7,606,245 B2 | 10/2009 | Ma et al. |
| 7,609,567 B2 | 10/2009 | Rajan et al. |
| 7,613,880 B2 | 11/2009 | Miura et al. |

| | | |
|---|---|---|
| 7,619,912 B2 | 11/2009 | Bhakta et al. |
| 7,724,589 B2 | 5/2010 | Rajan et al. |
| 7,730,338 B2 | 6/2010 | Rajan et al. |
| 7,761,724 B2 | 7/2010 | Rajan et al. |
| 7,934,070 B2 | 4/2011 | Brittain et al. |
| 7,990,797 B2 | 8/2011 | Moshayedi et al. |
| 2001/0000822 A1 | 5/2001 | Dell et al. |
| 2001/0003198 A1 | 6/2001 | Wu |
| 2001/0011322 A1 | 8/2001 | Stolt et al. |
| 2001/0019509 A1* | 9/2001 | Aho et al. .................. 365/205 |
| 2001/0021106 A1 | 9/2001 | Weber et al. |
| 2001/0021137 A1 | 9/2001 | Kai et al. |
| 2001/0046129 A1 | 11/2001 | Broglia et al. |
| 2001/0046163 A1 | 11/2001 | Yanagawa |
| 2002/0004897 A1 | 1/2002 | Kao et al. |
| 2002/0015340 A1 | 2/2002 | Batinovich |
| 2002/0019961 A1 | 2/2002 | Blodgett |
| 2002/0034068 A1 | 3/2002 | Weber et al. |
| 2002/0038405 A1 | 3/2002 | Leddige et al. |
| 2002/0041507 A1 | 4/2002 | Woo et al. |
| 2002/0051398 A1 | 5/2002 | Mizugaki .................. 365/222 |
| 2002/0060945 A1 | 5/2002 | Ikeda |
| 2002/0060948 A1 | 5/2002 | Chang et al. |
| 2002/0064073 A1 | 5/2002 | Chien |
| 2002/0064083 A1 | 5/2002 | Ryu et al. |
| 2002/0089831 A1 | 7/2002 | Forthun |
| 2002/0089970 A1 | 7/2002 | Asada et al. |
| 2002/0094671 A1 | 7/2002 | Distefano et al. |
| 2002/0121650 A1 | 9/2002 | Minamio et al. |
| 2002/0121670 A1 | 9/2002 | Minamio et al. |
| 2002/0124195 A1 | 9/2002 | Nizar |
| 2002/0129204 A1 | 9/2002 | Leighnor et al. |
| 2002/0145900 A1 | 10/2002 | Schaefer |
| 2002/0165706 A1 | 11/2002 | Raynham .................. 703/25 |
| 2002/0167092 A1 | 11/2002 | Fee et al. |
| 2002/0172024 A1 | 11/2002 | Hui et al. |
| 2002/0174274 A1 | 11/2002 | Wu et al. |
| 2002/0184438 A1 | 12/2002 | Usui |
| 2003/0002262 A1 | 1/2003 | Benisek et al. |
| 2003/0011993 A1 | 1/2003 | Summers et al. |
| 2003/0021175 A1 | 1/2003 | Tae Kwak |
| 2003/0026155 A1 | 2/2003 | Yamagata |
| 2003/0026159 A1 | 2/2003 | Frankowsky et al. |
| 2003/0035312 A1 | 2/2003 | Halbert et al. |
| 2003/0039158 A1 | 2/2003 | Horiguchi et al. |
| 2003/0041295 A1 | 2/2003 | Hou et al. |
| 2003/0061458 A1 | 3/2003 | Wilcox et al. |
| 2003/0061459 A1 | 3/2003 | Aboulenein et al. |
| 2003/0083855 A1 | 5/2003 | Fukuyama |
| 2003/0088743 A1 | 5/2003 | Rader |
| 2003/0093614 A1 | 5/2003 | Kohn et al. |
| 2003/0101392 A1 | 5/2003 | Lee |
| 2003/0105932 A1 | 6/2003 | David et al. |
| 2003/0117875 A1 | 6/2003 | Lee et al. |
| 2003/0123389 A1 | 7/2003 | Russell et al. |
| 2003/0126338 A1 | 7/2003 | Dodd et al. |
| 2003/0127737 A1 | 7/2003 | Takahashi |
| 2003/0131160 A1 | 7/2003 | Hampel et al. |
| 2003/0145163 A1 | 7/2003 | Seo et al. .................. 711/106 |
| 2003/0158995 A1 | 8/2003 | Lee et al. |
| 2003/0164539 A1 | 9/2003 | Yau |
| 2003/0164543 A1 | 9/2003 | Kheng Lee |
| 2003/0182513 A1 | 9/2003 | Dodd et al. |
| 2003/0183934 A1 | 10/2003 | Barrett |
| 2003/0189868 A1 | 10/2003 | Riesenman et al. |
| 2003/0189870 A1 | 10/2003 | Wilcox |
| 2003/0191888 A1 | 10/2003 | Klein |
| 2003/0191915 A1 | 10/2003 | Saxena et al. |
| 2003/0200382 A1 | 10/2003 | Wells et al. |
| 2003/0200474 A1 | 10/2003 | Li |
| 2003/0205802 A1 | 11/2003 | Segaram et al. |
| 2003/0206476 A1 | 11/2003 | Joo |
| 2003/0217303 A1 | 11/2003 | Chua-Eoan et al. |
| 2003/0223290 A1 | 12/2003 | Park et al. .................. 365/200 |
| 2003/0227798 A1 | 12/2003 | Pax |
| 2003/0229821 A1 | 12/2003 | Ma |
| 2003/0230801 A1 | 12/2003 | Jiang et al. |
| 2003/0231540 A1 | 12/2003 | Lazar et al. |
| 2003/0231542 A1 | 12/2003 | Zaharinova-Papazova et al. |
| 2004/0016994 A1 | 1/2004 | Huang |
| 2004/0027902 A1 | 2/2004 | Ooishi et al. |
| 2004/0034732 A1 | 2/2004 | Valin et al. |
| 2004/0034755 A1 | 2/2004 | LaBerge et al. |
| 2004/0037133 A1 | 2/2004 | Park et al. .................. 365/202 |
| 2004/0042503 A1 | 3/2004 | Shaeffer et al. |
| 2004/0044808 A1 | 3/2004 | Salmon et al. |
| 2004/0047228 A1 | 3/2004 | Chen |
| 2004/0057317 A1 | 3/2004 | Schaefer |
| 2004/0064647 A1 | 4/2004 | DeWhitt et al. |
| 2004/0064767 A1 | 4/2004 | Huckaby et al. |
| 2004/0083324 A1 | 4/2004 | Rabinovitz et al. |
| 2004/0088475 A1 | 5/2004 | Streif et al. |
| 2004/0117723 A1 | 6/2004 | Foss |
| 2004/0123173 A1 | 6/2004 | Emberling et al. .................. 714/733 |
| 2004/0125635 A1 | 7/2004 | Kuzmenka |
| 2004/0133736 A1 | 7/2004 | Kyung .................. 711/105 |
| 2004/0139359 A1 | 7/2004 | Samson et al. |
| 2004/0145963 A1 | 7/2004 | Byon |
| 2004/0151038 A1 | 8/2004 | Ruckerbauer et al. |
| 2004/0174765 A1 | 9/2004 | Seo et al. |
| 2004/0177079 A1 | 9/2004 | Gluhovsky et al. .................. 707/100 |
| 2004/0178824 A1 | 9/2004 | Pan |
| 2004/0184324 A1 | 9/2004 | Pax |
| 2004/0186956 A1 | 9/2004 | Perego et al. |
| 2004/0188704 A1 | 9/2004 | Halbert et al. |
| 2004/0195682 A1 | 10/2004 | Kimura |
| 2004/0196732 A1 | 10/2004 | Lee |
| 2004/0205433 A1 | 10/2004 | Gower et al. |
| 2004/0208173 A1 | 10/2004 | Di Gregorio .................. 370/360 |
| 2004/0225858 A1 | 11/2004 | Brueggen |
| 2004/0228166 A1 | 11/2004 | Braun et al. |
| 2004/0228203 A1 | 11/2004 | Koo |
| 2004/0230932 A1 | 11/2004 | Dickmann |
| 2004/0236877 A1 | 11/2004 | Burton |
| 2004/0250989 A1 | 12/2004 | Im et al. |
| 2004/0256638 A1 | 12/2004 | Perego et al. |
| 2004/0257847 A1 | 12/2004 | Matsui et al. |
| 2004/0260957 A1 | 12/2004 | Jeddeloh et al. |
| 2004/0264255 A1 | 12/2004 | Royer |
| 2004/0268161 A1 | 12/2004 | Ross |
| 2005/0018495 A1 | 1/2005 | Bhakta et al. |
| 2005/0021874 A1 | 1/2005 | Georgiou et al. |
| 2005/0024963 A1 | 2/2005 | Jakobs et al. |
| 2005/0027928 A1 | 2/2005 | Avraham et al. .................. 711/103 |
| 2005/0028038 A1 | 2/2005 | Pomaranski et al. |
| 2005/0036350 A1 | 2/2005 | So et al. |
| 2005/0041504 A1 | 2/2005 | Perego et al. |
| 2005/0044303 A1 | 2/2005 | Perego et al. |
| 2005/0044305 A1 | 2/2005 | Jakobs et al. |
| 2005/0047192 A1 | 3/2005 | Matsui et al. |
| 2005/0071543 A1 | 3/2005 | Ellis et al. |
| 2005/0078532 A1 | 4/2005 | Ruckerbauer et al. |
| 2005/0081085 A1 | 4/2005 | Ellis et al. |
| 2005/0086548 A1 | 4/2005 | Haid et al. |
| 2005/0099834 A1 | 5/2005 | Funaba et al. |
| 2005/0102590 A1 | 5/2005 | Norris et al. |
| 2005/0105318 A1 | 5/2005 | Funaba et al. |
| 2005/0108460 A1 | 5/2005 | David |
| 2005/0127531 A1 | 6/2005 | Tay et al. |
| 2005/0132158 A1 | 6/2005 | Hampel et al. .................. 711/167 |
| 2005/0135176 A1 | 6/2005 | Ramakrishnan et al. |
| 2005/0138267 A1 | 6/2005 | Bains et al. |
| 2005/0138304 A1 | 6/2005 | Ramakrishnan et al. |
| 2005/0139977 A1 | 6/2005 | Nishio et al. |
| 2005/0141199 A1 | 6/2005 | Chiou et al. |
| 2005/0149662 A1 | 7/2005 | Perego et al. |
| 2005/0152212 A1 | 7/2005 | Yang et al. |
| 2005/0156934 A1 | 7/2005 | Perego et al. |
| 2005/0166026 A1 | 7/2005 | Ware et al. |
| 2005/0193163 A1 | 9/2005 | Perego et al. |
| 2005/0193183 A1 | 9/2005 | Barth et al. |
| 2005/0194676 A1 | 9/2005 | Fukuda et al. |
| 2005/0194991 A1 | 9/2005 | Dour et al. |
| 2005/0195629 A1 | 9/2005 | Leddige et al. |
| 2005/0201063 A1 | 9/2005 | Lee et al. |
| 2005/0204111 A1 | 9/2005 | Natarajan |
| 2005/0207255 A1 | 9/2005 | Perego et al. |
| 2005/0210196 A1 | 9/2005 | Perego et al. |

| | | | | | | |
|---|---|---|---|---|---|---|
| 2005/0223179 A1 | 10/2005 | Perego et al. | | 2007/0106860 A1 | 5/2007 | Foster, Sr. et al. ............ 711/170 |
| 2005/0224948 A1 | 10/2005 | Lee et al. | | 2007/0136537 A1 | 6/2007 | Doblar et al. |
| 2005/0232049 A1 | 10/2005 | Park | | 2007/0162700 A1 | 7/2007 | Fortin et al. |
| 2005/0235119 A1 | 10/2005 | Sechrest et al. | | 2007/0188997 A1 | 8/2007 | Hockanson et al. |
| 2005/0235131 A1 | 10/2005 | Ware | | 2007/0192563 A1 | 8/2007 | Rajan et al. ................. 711/202 |
| 2005/0237838 A1 | 10/2005 | Kwak et al. .................. 365/222 | | 2007/0195613 A1 | 8/2007 | Rajan et al. .............. 365/189.05 |
| 2005/0243635 A1 | 11/2005 | Schaefer | | 2007/0204075 A1 | 8/2007 | Rajan et al. |
| 2005/0246558 A1 | 11/2005 | Ku | | 2007/0216445 A1 | 9/2007 | Raghavan et al. .............. 326/83 |
| 2005/0249011 A1 | 11/2005 | Maeda | | 2007/0247194 A1 | 10/2007 | Jain ................................ 326/87 |
| 2005/0259504 A1 | 11/2005 | Murtugh et al. | | 2007/0279084 A1 | 12/2007 | Oh et al. |
| 2005/0263312 A1 | 12/2005 | Bolken et al. | | 2007/0288683 A1 | 12/2007 | Panabaker et al. |
| 2005/0265506 A1 | 12/2005 | Foss et al. | | 2007/0288686 A1 | 12/2007 | Arcedera et al. ............. 711/103 |
| 2005/0269715 A1 | 12/2005 | Yoo | | 2007/0288687 A1 | 12/2007 | Panabaker et al. |
| 2005/0278474 A1 | 12/2005 | Perersen et al. | | 2008/0002447 A1 | 1/2008 | Gulachenski et al. |
| 2005/0281096 A1 | 12/2005 | Bhakta et al. | | 2008/0010435 A1 | 1/2008 | Smith et al. |
| 2005/0281123 A1 | 12/2005 | Bell et al. | | 2008/0025108 A1 | 1/2008 | Rajan et al. .............. 365/189.05 |
| 2005/0283572 A1 | 12/2005 | Ishihara | | 2008/0025122 A1 | 1/2008 | Schakel et al. ................. 365/222 |
| 2005/0285174 A1 | 12/2005 | Saito et al. | | 2008/0025136 A1 | 1/2008 | Rajan et al. .............. 365/230.08 |
| 2005/0286334 A1 | 12/2005 | Saito et al. | | 2008/0025137 A1 | 1/2008 | Rajan et al. .................... 365/239 |
| 2005/0289292 A1 | 12/2005 | Morrow et al. | | 2008/0027697 A1 | 1/2008 | Rajan et al. ....................... 703/14 |
| 2005/0289317 A1 | 12/2005 | Liou et al. ...................... 711/170 | | 2008/0027702 A1 | 1/2008 | Rajan et al. ....................... 703/21 |
| 2006/0002201 A1 | 1/2006 | Janzen ........................... 365/191 | | 2008/0027703 A1 | 1/2008 | Rajan et al. ....................... 703/21 |
| 2006/0010339 A1 | 1/2006 | Klein | | 2008/0028135 A1 | 1/2008 | Rajan et al. |
| 2006/0026484 A1 | 2/2006 | Hollums ....................... 714/746 | | 2008/0028136 A1 | 1/2008 | Schakel et al. ................. 711/106 |
| 2006/0038597 A1 | 2/2006 | Becker et al. | | 2008/0028137 A1 | 1/2008 | Schakel et al. |
| 2006/0039204 A1 | 2/2006 | Cornelius | | 2008/0031030 A1 | 2/2008 | Rajan et al. ....................... 365/63 |
| 2006/0039205 A1 | 2/2006 | Cornelius | | 2008/0031072 A1 | 2/2008 | Rajan et al. .................... 365/227 |
| 2006/0041711 A1 | 2/2006 | Miura et al. | | 2008/0037353 A1 | 2/2008 | Rajan et al. .................... 365/227 |
| 2006/0041730 A1 | 2/2006 | Larson | | 2008/0056014 A1 | 3/2008 | Rajan et al. .............. 365/189.03 |
| 2006/0044909 A1 | 3/2006 | Kinsley et al. ................. 365/222 | | 2008/0062773 A1 | 3/2008 | Rajan et al. .............. 365/189.03 |
| 2006/0044913 A1 | 3/2006 | Klein et al. | | 2008/0065820 A1 | 3/2008 | Gillingham et al. |
| 2006/0049502 A1 | 3/2006 | Goodwin et al. | | 2008/0082763 A1 | 4/2008 | Rajan et al. .................... 711/154 |
| 2006/0050574 A1 | 3/2006 | Streif et al. | | 2008/0086588 A1 | 4/2008 | Danilak et al. |
| 2006/0056244 A1 | 3/2006 | Ware ............................. 365/194 | | 2008/0089034 A1 | 4/2008 | Hoss et al. |
| 2006/0062047 A1 | 3/2006 | Bhakta et al. | | 2008/0098277 A1 | 4/2008 | Hazelzet |
| 2006/0067141 A1 | 3/2006 | Perego et al. | | 2008/0103753 A1 | 5/2008 | Rajan et al. |
| 2006/0085616 A1 | 4/2006 | Zeighami et al. | | 2008/0104314 A1 | 5/2008 | Rajan et al. |
| 2006/0087900 A1 | 4/2006 | Bucksch et al. | | 2008/0109206 A1 | 5/2008 | Rajan et al. |
| 2006/0090031 A1 | 4/2006 | Kirshenbaum et al. | | 2008/0109595 A1 | 5/2008 | Rajan et al. |
| 2006/0090054 A1 | 4/2006 | Choi et al. | | 2008/0109597 A1 | 5/2008 | Schakel et al. |
| 2006/0106951 A1 | 5/2006 | Bains ................................ 710/5 | | 2008/0109598 A1 | 5/2008 | Schakel et al. |
| 2006/0112214 A1 | 5/2006 | Yeh | | 2008/0115006 A1 | 5/2008 | Smith et al. .................... 713/601 |
| 2006/0112219 A1 | 5/2006 | Chawla et al. | | 2008/0120443 A1 | 5/2008 | Rajan et al. |
| 2006/0117152 A1 | 6/2006 | Amidi et al. ................... 711/154 | | 2008/0120458 A1 | 5/2008 | Gillingham et al. |
| 2006/0117160 A1 | 6/2006 | Jackson et al. | | 2008/0123459 A1 | 5/2008 | Rajan et al. .................... 365/227 |
| 2006/0118933 A1 | 6/2006 | Haba | | 2008/0126624 A1 | 5/2008 | Prete et al. |
| 2006/0120193 A1 | 6/2006 | Casper | | 2008/0126687 A1 | 5/2008 | Rajan et al. |
| 2006/0123265 A1 | 6/2006 | Ruckerbauer et al. | | 2008/0126688 A1 | 5/2008 | Rajan et al. |
| 2006/0126369 A1 | 6/2006 | Raghuram | | 2008/0126689 A1 | 5/2008 | Rajan et al. |
| 2006/0129712 A1 | 6/2006 | Raghuram | | 2008/0126690 A1 | 5/2008 | Rajan et al. .................... 711/105 |
| 2006/0129740 A1 | 6/2006 | Ruckerbauer et al. | | 2008/0126692 A1 | 5/2008 | Rajan et al. |
| 2006/0129755 A1 | 6/2006 | Raghuram | | 2008/0133825 A1 | 6/2008 | Rajan et al. |
| 2006/0133173 A1 | 6/2006 | Jain et al. | | 2008/0155136 A1 | 6/2008 | Hishino |
| 2006/0136791 A1 | 6/2006 | Nierle | | 2008/0159027 A1 | 7/2008 | Kim |
| 2006/0149982 A1 | 7/2006 | Vogt | | 2008/0170425 A1 | 7/2008 | Rajan |
| 2006/0174082 A1 | 8/2006 | Bellows et al. | | 2008/0215832 A1 | 9/2008 | Allen et al. |
| 2006/0176744 A1 | 8/2006 | Stave | | 2008/0239857 A1 | 10/2008 | Rajan et al. .................... 365/227 |
| 2006/0179262 A1 | 8/2006 | Brittain et al. | | 2008/0239858 A1 | 10/2008 | Rajan et al. .................... 365/227 |
| 2006/0179333 A1 | 8/2006 | Brittain et al. | | 2008/0256282 A1 | 10/2008 | Guo et al. |
| 2006/0179334 A1 | 8/2006 | Brittain et al. | | 2009/0024789 A1 | 1/2009 | Rajan et al. |
| 2006/0180926 A1 | 8/2006 | Mullen et al. | | 2009/0024790 A1 | 1/2009 | Rajan et al. |
| 2006/0181953 A1 | 8/2006 | Rotenbert et al. | | 2009/0109613 A1 | 4/2009 | Legen et al. |
| 2006/0195631 A1 | 8/2006 | Rajamani | | 2009/0216939 A1 | 8/2009 | Smith et al. |
| 2006/0198178 A1 | 9/2006 | Kinsley et al. | | 2009/0285031 A1 | 11/2009 | Rajan et al. |
| 2006/0203590 A1 | 9/2006 | Mori et al. | | 2009/0290442 A1 | 11/2009 | Rajan |
| 2006/0206738 A1 | 9/2006 | Jeddeloh et al. | | 2010/0005218 A1 | 1/2010 | Gower et al. |
| 2006/0233012 A1 | 10/2006 | Sekiguchi et al. | | 2010/0020585 A1 | 1/2010 | Rajan |
| 2006/0236165 A1 | 10/2006 | Cepulis et al. | | 2010/0257304 A1 | 10/2010 | Rajan et al. |
| 2006/0236201 A1 | 10/2006 | Gower et al. | | 2010/0271888 A1 | 10/2010 | Rajan |
| 2006/0248261 A1 | 11/2006 | Jacob et al. | | 2010/0281280 A1 | 11/2010 | Rajan et al. |
| 2006/0248387 A1 | 11/2006 | Nicholson et al. | | | | |
| 2006/0262586 A1 | 11/2006 | Solomon et al. | | FOREIGN PATENT DOCUMENTS | | |
| 2006/0294295 A1 | 12/2006 | Fukuzo | | DE | 102005036528 | 2/2007 |
| 2007/0005998 A1 | 1/2007 | Jain et al. | | JP | 62121978 | 6/1987 |
| 2007/0050530 A1 | 3/2007 | Rajan ............................ 711/5 | | JP | 01-171047 | 7/1989 |
| 2007/0058471 A1 | 3/2007 | Rajan et al. .................... 365/222 | | JP | 03-29357 | 2/1991 |
| 2007/0070669 A1 | 3/2007 | Tsern | | JP | 03-276487 B2 | 12/1991 |
| 2007/0088995 A1 | 4/2007 | Tsern et al. | | JP | 03-286234 | 12/1991 |
| 2007/0091696 A1 | 4/2007 | Niggemeier et al. | | JP | 07-141870 | 6/1995 |

| | | |
|---|---|---|
| JP | 08-77097 | 3/1996 |
| JP | 11-149775 | 6/1999 |
| JP | 22025255 A2 | 1/2002 |
| JP | 3304893 B2 | 5/2002 |
| JP | 2006236388 | 9/2006 |
| KR | 1020040062717 | 7/2004 |
| WO | WO9900734 | 1/1999 |
| WO | WO00/45270 | 8/2000 |
| WO | WO2004/051645 | 6/2004 |
| WO | WO2007002324 | 1/2007 |
| WO | WO2007/028109 | 3/2007 |
| WO | WO2007/095080 | 8/2007 |
| WO | WO2008063251 | 5/2008 |

OTHER PUBLICATIONS

Wu, et al. "Envy: A Non-Volatile, Main Memory Storage System", ASPLOS-VI Proceedings—Sixth International Conference on Architectural Support for Programming Languages and Operating Systems, San Jose, CA. Oct. 4-7, 1994. SIGARCH Computer Architecture News 22 (Special Issue Oct. 1994), SIGOPS Operating Systems Review 28(5) 1994, and SIGPLAN Notices 29 (11) 1994.
German Office Action From German Patent Application No. 11 2006 002 300.4-55 Mailed Jun. 5, 2009 (With Translation).
Non-Final Office Action From U.S. Appl. No. 11/461,430 Mailed Feb. 19, 2009.
Final Office Action From U.S. Appl. No. 11/461,435 Mailed Jan. 28, 2009.
Notice of Allowance from U.S. Appl. No. 11/762,010 Dated Jun. 8, 2011.
Non-Final Office Action from U.S. Appl. No. 11/672,924 Dated Jun. 8, 2011.
Non-Final Office Action from U.S. Appl. No. 11/929,225 Dated Jun. 8, 2011.
Notice of Allowance from U.S. Appl. No. 11/929,500 Dated Jun. 13, 2011.
Notice of Allowance from U.S. Appl. No. 11/941,589 Dated Jun. 15, 2011.
Final Office Action from U.S. Appl. No. 12/769,428 Dated Jun. 16, 2011.
Notice of Allowance from U.S. Appl. No. 12/203,100 Dated Jun. 17, 2011.
Notice of Allowance from U.S. Appl. No. 11/762,013 Dated Jun. 20, 2011.
Non-Final Office Action from U.S. Appl. No. 12/797,557 Dated Jun. 21, 2011.
Notice of Allowance from U.S. Appl. No. 11/929,483 Dated Jun. 23, 2011.
Non-Final Office Action from U.S. Appl. No. 11/702,960 Dated Jun. 23, 2011.
Non-Final Office Action from U.S. Appl. No. 11/929,655 Dated Jun. 24, 2011.
Notice of Allowance from U.S. Appl. No. 11/763,365 Dated Jun. 24, 2011.
Notice of Allowance from U.S. Appl. No. 11/611,374 Dated Jun. 24, 2011.
Non-Final Office Action from U.S. Appl. No. 11/828,182 Dated Jun. 27, 2011.
Non-Final Office Action from U.S. Appl. No. 11/828,181 Dated Jun. 27, 2011.
Non-Final Office Action from U.S. Appl. No. 12/378,328 Dated Jul. 15, 2011.
Final Office Action from U.S. Appl. No. 11/461,420 Dated Jul. 20, 2011.
Notice of Allowance from U.S. Appl. No. 11/461,437 Dated Jul. 25, 2011.
Notice of Allowance from U.S. Appl. No. 11/702,981 Dated Aug. 5, 2011.
Notice of Allowability from U.S. Appl. No. 11/855,826 Dated Aug. 15, 2011.
Non-Final Office Action from U.S. Appl. No. 12/574,628 Dated Sep. 20, 2011.
Non-Final Office Action from U.S. Appl. No. 11/858,518 Dated Sep. 27, 2011.
Notice of Allowance from U.S. Appl. No. 11/929,571 Dated Sep. 27, 2011.
Notice of Allowance from U.S. Appl. No. 11/929,500 Dated Sep. 27, 2011.
Notice of Allowance from U.S. Appl. No. 11/941,589 Dated Sep. 30, 2011.
Notice of Allowance from U.S. Appl. No. 12/816,756 Dated Oct. 3, 2011.
Non-Final Office Action from U.S. Appl. No. 12/508,496 Dated Oct. 11, 2011.
Non-Final Office Action from U.S. Appl. No. 11/588,739 Dated Oct. 13, 2011.
Notice of Allowance from U.S. Appl. No. 11/939,432 Dated Oct. 24, 2011.
Non-Final Office Action from U.S. Appl. No. 11/929,631 Dated Nov. 1, 2011.
Notice of Allowance from U.S. Appl. No. 11/515,223 Dated Nov. 29, 2011.
Notice of Allowance from U.S. Appl. No. 12/769,428 Dated Nov. 29, 2011.
Final Office Action from U.S. Appl. No. 11/939,440 Dated Dec. 12, 2011.
Notice of Allowance from U.S. Appl. No. 11/762,013 Dated Feb. 23, 2011.
Notice of Allowance from U.S. Appl. No. 11/929,500 Dated Feb. 24, 2011.
Notice of Allowance from U.S. Appl. No. 11/763,365 Dated Mar. 1, 2011.
Final Office Action from U.S. Appl. No. 12/574,628 Dated Mar. 3, 2011.
Final Office Action from U.S. Appl. No. 11/929,571 Dated Mar. 3, 2011.
Notice of Allowance from U.S. Appl. No. 11/611,374 Dated Mar. 4, 2011.
Notice of Allowance from U.S. Appl. No. 11/929,483 Dated Mar. 4, 2011.
Notice of Allowance from U.S. Appl. No. 11/553,399 Dated Mar. 18, 2011.
Final Office Action from U.S. Appl. No. 12/507,682 Dated Mar. 29, 2011.
Non-Final Office Action from U.S. Appl. No. 11/929,403 Dated Mar. 31, 2011.
Notice of Allowance from U.S. Appl. No. 12/838,896 Dated Apr. 19, 2011.
Notice of Allowance from U.S. Appl. No. 11/702,981 Dated Apr. 25, 2011.
Notice of Allowance from U.S. Appl. No. 11/929,320 Dated May 5, 2011.
Final Office Action from U.S. Appl. No. 11/939,440 Dated May 19, 2011.
Final Office Action from U.S. Appl. No. 11/855,805, Dated May 26, 2011.
Non-Final Office Action from U.S. Appl. No. 11/672,921 Dated May 27, 2011.
Non-Final Office Action from U.S. Appl. No. 11/553,372 Dated Nov. 14, 2011.
Notice of Allowance from U.S. Appl. No. 12/797,557 Dated Dec. 28, 2011.
Office Action, including English translation, from co-pending Japanese application No. 2008-529353, Dated Jan. 10, 2012.
Notice of Allowance from U.S. Appl. No. 12/838,896 Dated Jan. 18, 2012.
Final Office Action from U.S. Appl. No. 11/929,655 Dated Jan. 19, 2012.
Final Office Action from U.S. Appl. No. 12/378,328 Dated Feb. 3, 2012.
Final Office Action from U.S. Appl. No. 11/672,921 Dated Feb. 16, 2012.
Final Office Action from U.S. Appl. No. 11/672,924 Dated Feb. 16, 2012.
Final Office Action from U.S. Appl. No. 11/929,225 Dated Feb. 16, 2012.

International Search Report for Application No. EP12150807 Dated Feb. 16, 2012.
Final Office Action from U.S. Appl. No. 11/828,181 Dated Feb. 23, 2012.
Non-Final Office Action from U.S. Appl. No. 11/461,520 Dated Feb. 29, 2012.
Notice of Allowance from U.S. Appl. No. 12/574,628 Dated Mar. 6, 2012.
Non-Final Office Action from U.S. Appl. No. 13/276,212 Dated Mar. 15, 2012.
Non-Final Office Action from U.S. Appl. No. 13/343,612 Dated Mar. 29, 2012.
Notice of Allowance from U.S. Appl. No. 11/939,440 Dated Mar. 30, 2012.
European Search Report from co-pending European application No. 11194876.6-2212/2450798, Dated Apr. 12, 2012.
European Search Report from co-pending European application No. 11194862.6-2212/2450800, Dated Apr. 12, 2012.
Notice of Allowance from U.S. Appl. No. 11/929,636, Dated Apr. 17, 2012.
Final Office Action from U.S. Appl. No. 11/858,518, Dated Apr. 17, 2012.
European Search Report from co-pending European application No. 11194883.2-2212, Dated Apr. 27, 2012.
Non-Final Office Action from U.S. Appl. No. 11/553,372, Dated May 3, 2012.
Notice of Allowance from U.S. Appl. No. 11/929,631, Dated May 3, 2012.
Non-Final Office Action from U.S. Appl. No. 13/165,713, Dated May 22, 2012.
Non-Final Office Action from U.S. Appl. No. 12/144,396, Dated May 29, 2012.
Non-Final Office Action from U.S. Appl. No. 13/165,713, Dated May 31, 2012.
Non-Final Office Action from U.S. Appl. No. 13/280,251, Dated Jun. 12, 2012.
Final Office Action from U.S. Appl. No. 11/855,805, Dated Jun. 14, 2012.
Office Action from U.S. Appl. No. 11/461,427 mailed on Sep. 5, 2008.
Final Office Action from U.S. Appl. No. 11/461,430 mailed on Sep. 8, 2008.
Notice of Allowance from U.S. Appl. No. 11/474,075 mailed on Nov. 26, 2008.
Office Action from U.S. Appl. No. 11/474,076 mailed on Nov. 3, 2008.
Office Action from U.S. Appl. No. 11/524,811 mailed on Sep. 17, 2008.
Non-final Office Action from U.S. Appl. No. 11/461,430 mailed on Feb. 19, 2009.
Final Office Action from U.S. Appl. No. 11/461,435 mailed on Jan. 28, 2009.
Non-final Office Action from U.S. Appl. No. 11/461,437 mailed on Jan. 26, 2009.
Fang et al., W. Power Complexity Analysis of Adiabatic SRAM, 6th Int. Conference on ASIC, vol. 1, Oct. 2005, pp. 334-337.
Pavan et al., P. A Complete Model of E2PROM Memory Cells for Circuit Simulations, IEEE Transactions on Computer-Aided Design of Integrated Circuits and Systems, vol. 22, No. 8, Aug. 2003, pp. 1072-1079.
German Office Action From German Patent Application No. 11 2006 001 810.8-55 Mailed Apr. 20, 2009 (With Translation).
Great Britain Office Action from GB Patent Application No. GB0800734.6 Mailed Mar. 1, 2010.
Final Office Action from U.S. Appl. No. 11/461,420 Mailed Apr. 28, 2010.
Notice of Allowance from U.S. Appl. No. 11/553,372 Mailed Mar. 12, 2010.
Notice of Allowance from U.S. Appl. No. 11/553,399 Mailed Mar. 22, 2010.
Non-Final Office Action from U.S. Appl. No. 11/588,739 Mailed Dec. 29, 2009.
Notice of Allowance from U.S. Appl. No. 11/611,374 Mailed Apr. 5, 2010.
Non-Final Office Action from U.S. Appl. No. 11/828,181 Mailed Mar. 2, 2010.
Non-Final Office Action from U.S. Appl. No. 11/828,182 Mailed Mar. 29, 2010.
Final Office Action from U.S. Appl. No. 11/858,518 Mailed Apr. 21, 2010.
Non-Final Office Action from U.S. Appl. No. 11/929,432 Mailed Jan. 14, 2010.
Non-Final Office Action from U.S. Appl. No. 11/929,571 Mailed Mar. 3, 2010.
Non-Final Office Action from U.S. Appl. No. 11/929,631 Mailed Mar. 3, 2010.
Non-Final Office Action from U.S. Appl. No. 11/929,636 Mailed Mar. 9, 2010.
Non-Final Office Action from U.S. Appl. No. 11/929,655 Mailed Mar. 3, 2010.
Notice of Allowance from U.S. Appl. No. 11/939,432 Mailed Dec. 1, 2009.
Non-Final Office Action from U.S. Appl. No. 11/939,432 Mailed Apr. 12, 2010.
Notice of Allowance from U.S. Appl. No. 12/111,819 Mailed Mar. 10, 2010.
Non-Final Office Action from U.S. Appl. No. 12/507,682 Mailed Mar. 8, 2010.
Final Rejection From U.S. Appl. No. 11/461,437 Mailed Nov. 10, 2009.
Final Rejection from U.S. Appl. No. 11/762,010 Mailed Dec. 4, 2009.
Non-Final Rejection from U.S. Appl. No. 11/672,921 Mailed Dec. 8, 2009.
Non-Final Rejection from U.S. Appl. No. 11/672,924 Mailed Dec. 14, 2009.
Non-Final Rejection from U.S. Appl. No. 11/929,225 Mailed Dec. 14, 2009.
Non-Final Rejection from U.S. Appl. No. 11/929,261 Mailed Dec. 14, 2009.
Notice of Allowance From U.S. Appl. No. 11/611,374 Mailed Nov. 30, 2009.
Notice of Allowance From U.S. Appl. No. 12/111,819 Mailed Nov. 20, 2009.
Notice of Allowance From U.S. Appl. No. 12/111,828 Mailed Dec. 15, 2009.
Non-Final Office Action From U.S. Appl. No. 11/461,437 Mailed Jan. 26, 2009.
Non-Final Office Action From U.S. Appl. No. 11/461,441 Mailed Apr. 2, 2009.
Non-Final Office Action From U.S. Appl. No. 11/611,374 Mailed Mar. 23, 2009.
Non-Final Office Action From U.S. Appl. No. 11/762,010 Mailed Mar. 20, 2009.
Non-Final Office Action From U.S. Appl. No. 11/939,432 Mailed Feb. 6, 2009.
Non-Final Office Action From U.S. Appl. No. 12/111,819 Mailed Apr. 27, 2009.
Non-Final Office Action From U.S. Appl. No. 12/111,828 Mailed Apr. 17, 2009.

* cited by examiner

HYBRID MEMORY MODULE

CROSS-REFERENCE TO RELATED APPLICATIONS

This application is a continuation-in-part of U.S. patent application Ser. No. 11/611,374, having a filed Dec. 15, 2006 now U.S. Pat. No. 8,055,833, which claims benefit of U.S. Provisional Patent Application Ser. No. 60/849,631, filed Oct. 5, 2006, all of which are herein incorporated by reference.

BACKGROUND OF THE INVENTION

1. Field of the Invention

Embodiments of the present invention generally relate to memory modules and, more specifically, to hybrid or mixed-technology memory modules.

2. Description of the Related Art

Memory systems in computers are typically built from memory modules. An example of a common type of memory module is a Dual Inline Memory Module or DIMM. The most common type of memory module is a DIMM that contains just one type of memory technology known as DRAM.

There are several new forms of semiconductor memory that are currently being developed, some as potential replacements for one-transistor-cell DRAM. Examples are Magnetoresistive Random Access Memory (MRAM), Phase-change memory (also known as PCM, PRAM, PCRAM, Ovonic Unified Memory and Chalcogenide RAM or C-RAM), Ferroelectric RAM (FRAM), Resistor RAM (RRAM), and Molecular Wire Crossbar Memory (MWCM). Most of these new memory technologies have system properties (most notably the read and write bandwidth and read and write latency) that are different from DRAM. In addition there are several flash memory technologies, such as NAND and NOR flash, that are attractive (because of their high density and low cost) for use as system memory, but again have system properties that are different from DRAM. Therefore, an ideal memory module would incorporate different types of memory while having a single memory interface with a host computer.

As the foregoing illustrates, what is needed in the art is a mixed-technology memory module architecture that combines different memory technologies while presenting a single, preferably standard, technology interface.

SUMMARY OF THE INVENTION

One embodiment of the present invention sets forth a hybrid memory module comprising a plurality of super-stacks and a first interface configured to transmit data between the plurality of super-stacks and a memory controller. Each super-stack includes a plurality of sub-stacks, a super-controller configured to control the plurality of sub-stacks, and a second interface configured to transmit data between the plurality of sub-stacks and the first interface.

One advantage of the disclosed hybrid memory module is that combining memory devices of different types allows utilizing the favorable properties of each type of the memory devices, while hiding their unfavorable properties from the memory controller. More specifically, combining slow memory devices and fast memory devices using the architecture of the hybrid memory module allows the long latency of the slow memory devices to be hidden, so that the hybrid memory module appears to the memory controller as a standard fast memory device characterized by having low latency.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention disclosed herein describe how to build standard DIMMs that contain more than one type of memory technology. An example of a mixed-technology DIMM is a module that combines flash memory with SRAM.

Figure 1A:
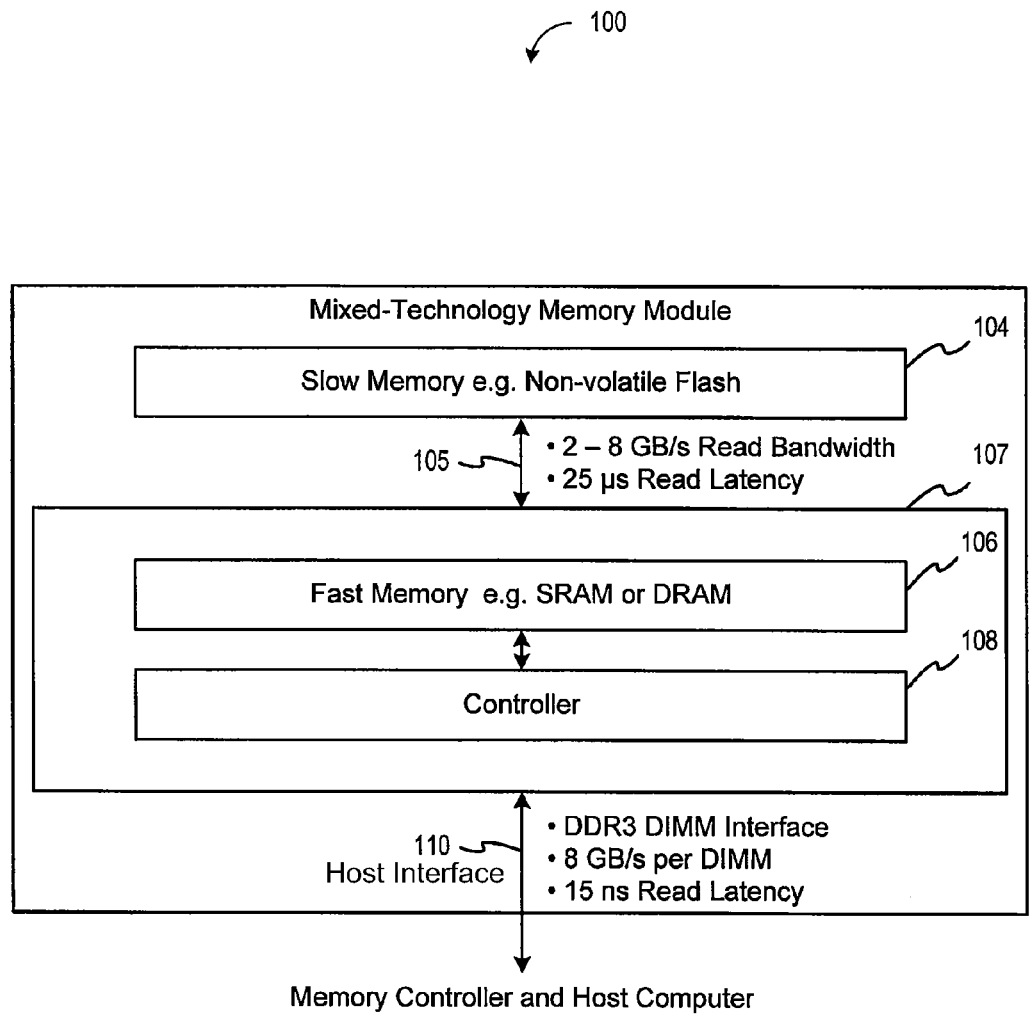
FIG. 1A shows an abstract and conceptual model of a mixed-technology memory module, according to one embodiment.

FIG. 1A shows an abstract and conceptual model of a mixed-technology memory module, according to one embodiment.

The mixed-technology memory module 100 shown in FIG. 1A has both slow memory and fast memory, with the combination architected so as to appear to a host computer as fast memory using a standard interface. The specific embodiment of the mixed-technology memory module 100, which will also be referred to as a HybridDIMM 100, shows both slow, non-volatile memory portion 104 (e.g. flash memory), and a latency-hiding buffer using fast memory 106 (e.g. using SRAM, DRAM, or embedded DRAM volatile memory), together with a controller 108. As shown in FIG. 1A, the combination of the fast and slow memory is presented to a host computer over a host interface 110 (also referred to herein as a DIMM interface 110) as a JEDEC-compatible standard DIMM. In one embodiment, the host interface 110 may communicate data between the mixed-technology memory module 100 and a memory controller within a host computer. The host interface 110 may be a standard DDR3 interface, for example. The DDR3 interface provides approximately 8 gigabyte/s read/write bandwidth per DIMM and a 15 nanosecond read latency when a standard DIMM uses standard DDR3 SDRAM. The host interface 110 may present any other JEDEC-compatible interface, or even, the host interface may present to the host system via a custom interface, and/or using a custom protocol.

The DDR3 host interface is defined by JEDEC as having 240 pins including data, command, control and clocking pins (as well as power and ground pins). There are two forms of the standard JEDEC DDR3 host interface using compatible 240-pin sockets: one set of pin definitions for registered DIMMs (R-DIMMs) and one set for unbuffered DIMMs (U-DIMMs). There are currently no unused or reserved pins in this JEDEC DDR3 standard. This is a typical situation in high-speed JEDEC standard DDR interfaces and other memory interfaces—that is normally all pins are used for very specific functions with few or no spare pins and very little flexibility in the use of pins. Therefore, it is advantageous and preferable to create a HybridDIMM that does not require any extra pins or signals on the host interface and uses the pins in a standard fashion.

In FIG. 1A, an interface 105 to the slow memory 104 may provide read bandwidth of 2-8 gigabyte/s with currently available flash memory chips depending on the exact number and arrangement of the memory chips on the HybridDIMM. Other configurations of the interface 105 are possible and envisioned by virtue of scaling the width and/or the signaling speed of the interface 105. However, in general, the slow memory 104, such as non-volatile memory (e.g. standard NAND flash memory), provides a read latency that is much longer than the read latency of the fast memory 106, such as DDR3 SDRAM, e.g. 25 microseconds for current flash chips versus 15 nanoseconds for DDR3 SDRAM.

The combination of the fast memory 106 and the controller 108, shown as an element 107 in FIG. 1A, allows the "bad" properties of the slow memory 104 (e.g. long latency) to be hidden from the memory controller and the host computer. When the memory controller performs an access to the mixed-technology memory module 100, the memory controller sees the "good" (e.g. low latency) properties of the fast memory 106. The fast memory 106 thus acts as a latency-hiding component to buffer the slow memory 104 and enable the HybridDIMM 100 to appear as if it were a standard memory module built using only the fast memory 106 operating on a standard fast memory bus.

Figure 1B:
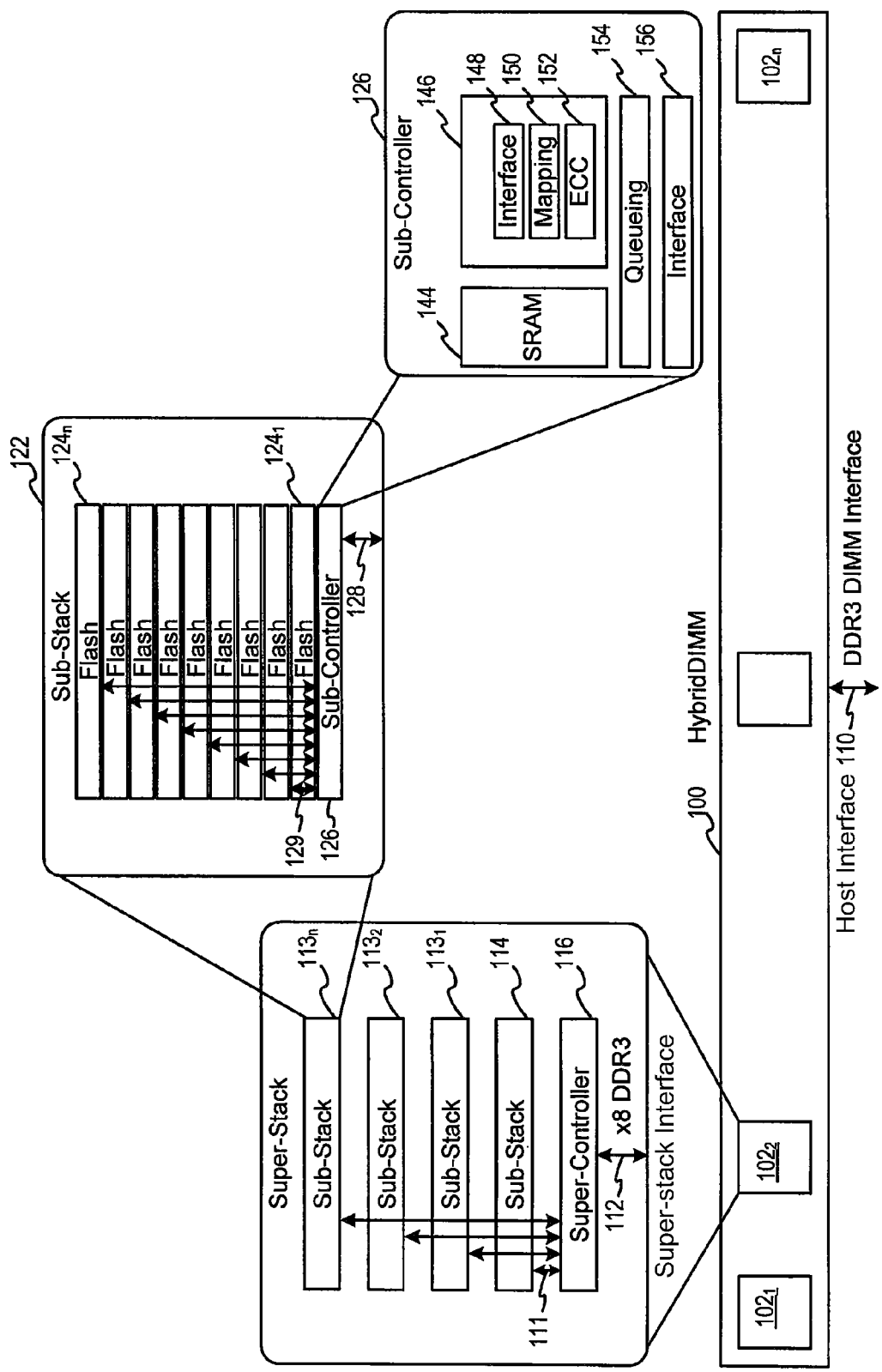
FIG. 1B is an exploded hierarchical view of a logical model of a HybridDIMM, according to one embodiment.

FIG. 1B is an exploded hierarchical view of a logical model of the HybridDIMM 100, according to one embodiment. While FIG. 1A depicts an abstract and conceptual model of the HybridDIMM 100, FIG. 1B is a specific embodiment of the HybridDIMM 100. FIG. 1B replaces the simple view of a single block of slow memory (the slow memory 104 in FIG. 1A) with a number of sub-assemblies or Sub-Stacks 122 that contain the slow memory (flash memory components 124). FIG. 1B also replaces the simple view of a single block of fast memory (the fast memory 106 in FIG. 1A) by SRAM 144 in a number of Sub-Controllers 126. Further, the simple view of a single controller (the controller 108 in FIG. 1A) is replaced now in FIG. 1B by the combination of a Super-Controller 116 and a number of Sub-Controllers 126. Of course, the particular HybridDIMM architecture shown in FIG. 1B is just one of many possible implementations of the more general architecture shown in FIG. 1A.

In the embodiment shown in FIG. 1B, the slow memory portion in the Sub-Stack 122 may use NAND flash, but, in alternative embodiments, could also use NOR flash, or any other relatively slow (relative to DRAM) memory. Also, in the embodiment shown in FIG. 1B, the fast memory in the Sub-Controller 126 comprises an SRAM 144, but could be comprised of DRAM, or embedded DRAM, or any other relatively fast (relative to flash) memory etc. Of course it is typical that memory made by use of differing technologies will exhibit different bandwidths and latencies. Accordingly, as a function of the overall architecture of the HybridDIMM 100, and in particular as a function of the Super-Controller 116, the differing access properties (including latency and bandwidth) inherent in the use of different memories are managed by logic. In other words, even though there may exist the situation where a one memory word is retrieved from (for example) SRAM, and another memory value retrieved from (for example) flash memory, the memory controller of the host computer (not shown) connected to the interface 110 is still presented with signaling and protocol as defined for just one of the aforementioned memories. For example, in the case that the memory controller requests a read of two memory words near a page boundary, 8 bits of data may be read from a memory value retrieved from (for example) SRAM 144, and 8 bits of data may be read from a memory value retrieved from (for example) the flash memory component 124.

Stated differently, any implementation of the HybridDIMM 100, may use at least two different memory technologies combined on the same memory module, and, as such, may use the lower latency fast memory as a buffer in order to mask the higher latency slow memory. Of course the foregoing combination is described as occurring on a single memory module, however the combination of a faster memory and a slower memory may be presented on the same bus, regardless of how the two types of memory are situated in the physical implementation.

The abstract model described above uses two types of memory on a single DIMM. Examples of such combinations include using any of DRAM, SRAM, flash, or any volatile or nonvolatile memory in any combination, but such combinations not limited to permutations involving only two memory types. For example, it is also possible to use SRAM, DRAM and flash memory circuits together in combination on a single mixed-technology memory module. In various embodiments, the HybridDIMM 100 may use on-chip SRAM together with DRAM to form the small but fast memory combined together with slow but large flash memory circuits in combination on a mixed-technology memory module to emulate a large and fast standard memory module.

Continuing into the hierarchy of the HybridDIMM 100, FIG. 1B shows multiple Super-Stack components $102_1$-$102_n$ (also referred to herein as Super-Stacks 102). Each Super-Stack 102 has an interface 112 that is shown in FIG. 1B as an 8-bit wide interface compatible with DDR3 SDRAMs with x8 organization, providing 8 bits to the DIMM interface 110. For example nine 8-bit wide Super-Stacks 102 may provide the 72 data bits of a DDR3 R-DIMM with ECC. Each Super-Stack 102 in turn comprises a Super-Controller 116 and at least one Sub-Stack 114. Additional Sub-Stacks $113_1$-$113_n$ (also referred to herein as Sub-Stacks 113) may be optionally disposed within any one or more of the Super-Stack components $102_1$-$102_n$.

The Sub-Stack 122 in FIG. 1B, intended to illustrate components of any of the Sub-Stack 114 or the additional Sub-Stacks 113, is comprised of a Sub-Controller 126 and at least one slow memory component, for example a plurality of flash memory components $124_1$-$124_n$ (also referred to herein as flash memory components 124). Further continuing into the hierarchy of the HybridDIMM 100, the Sub-Controller 126 may include fast memory, such as the SRAM 144, queuing logic 154, interface logic 156 and one or more flash controller(s) 146 which may provide functions such as interface logic 148, mapping logic 150, and error-detection and error-correction logic 152.

In preferred embodiments, the HybridDIMM 100 contains nine or eighteen Super-Stacks 102, depending for example, if the HybridDIMM 100 is populated on one side (using nine Super-Stacks 102) of the HybridDIMM 100 or on both sides (using eighteen Super-Stacks 102). However, depending on the width of the host interface 110 and the organization of the Super-Stacks 102 (and, thus, the width of the interface 112), any number of Super-Stacks 102 may be used. As mentioned earlier, the Super-Controllers 116 are in electrical communication with the memory controller of the host computer through the host interface 110, which is a JEDEC DDR3-compliant interface.

The number and arrangement of Super-Stacks 102, Super-Controllers 116, and Sub-Controllers 126 depends largely on the number of flash memory components 124. The number of flash memory components 124 depends largely on the bandwidth and the capacity required of the HybridDIMM 100. Thus, in order to increase capacity, a larger number and/or larger capacity flash memory components 124 may be used. In order to increase bandwidth the flash memory components 124 may be time-interleaved or time-multiplexed, which is one of the functions of the Sub-Controller 126. If only a small-capacity and low-bandwidth HybridDIMM 100 is required, then it is possible to reduce the number of Sub-Controllers 126 to one and merge that function together with the Super-Controller 116 in a single chip, possibly even merged together with the non-volatile memory. Such a small, low-bandwidth HybridDIMM 100 may be useful in laptop or desktop computers for example, or in embedded systems. If a large-capacity and high-bandwidth HybridDIMM 100 is required, then a number of flash memory components 124 may be connected to one or more of the Sub-Controller 126 and the Sub-Controllers 126 connected to the Super-Controller 116. In order to describe the most general form of Hybrd-DIMM 100, the descriptions below will focus on the Hybrid-DIMM 100 with separate Super-Controller 116 and multiple Sub-Controllers 126.

Figure 2:
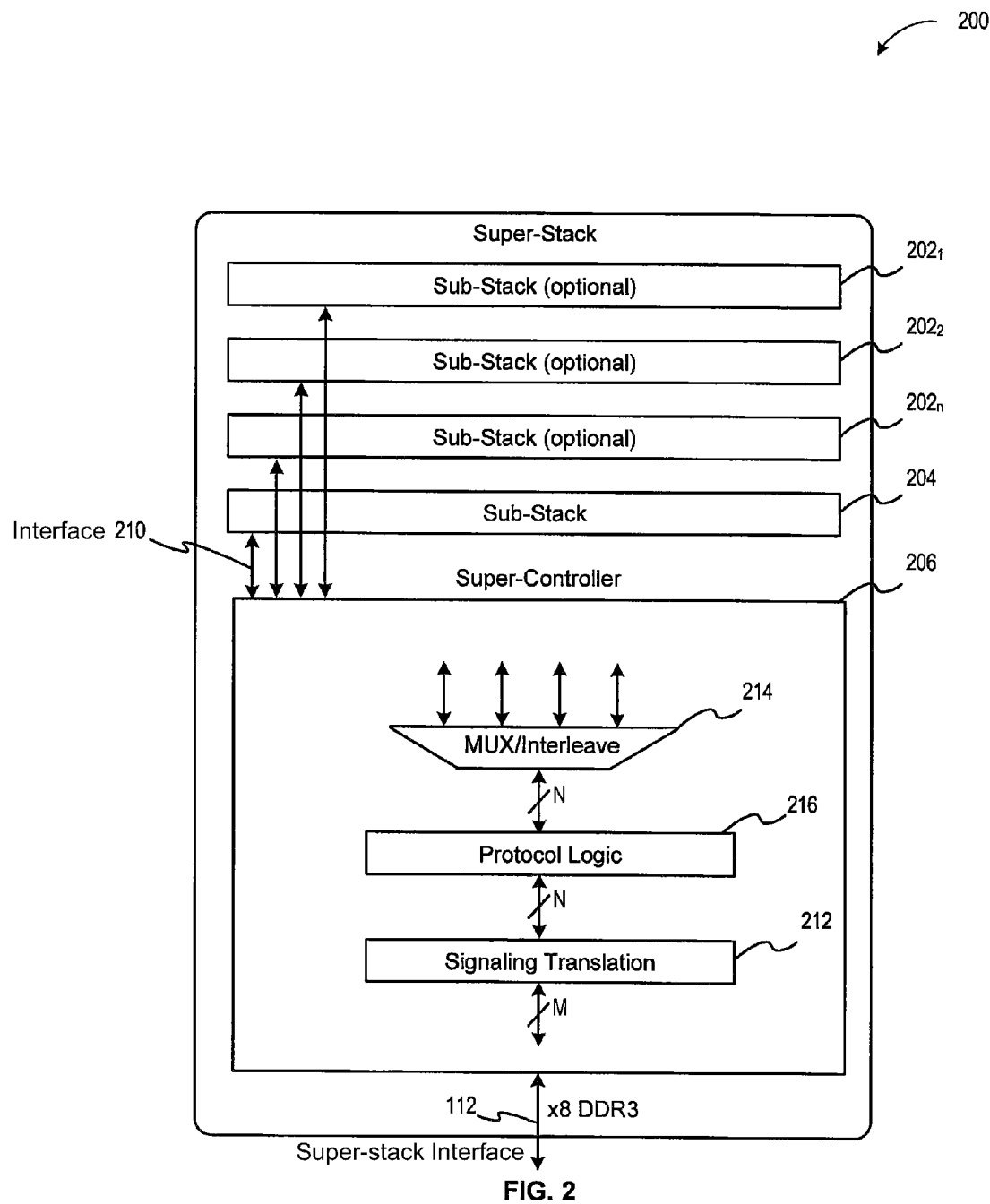
FIG. 2 shows a HybridDIMM Super-Stack with multiple Sub-stacks, according to one embodiment.
Figure 3:
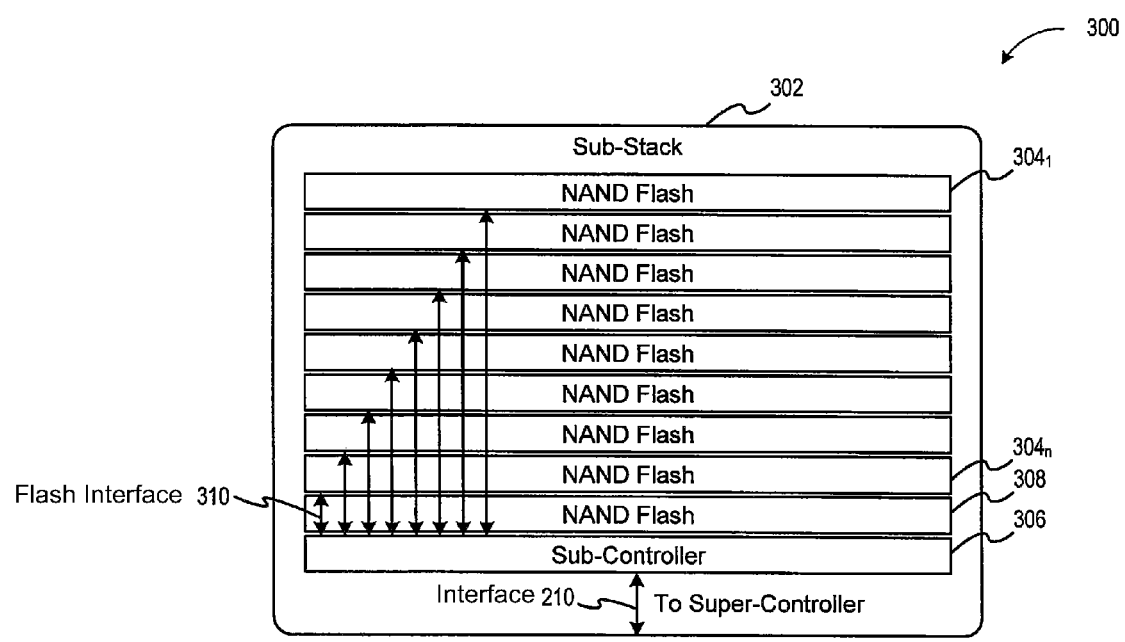
FIG. 3 shows a Sub-Stack showing a Sub-Controller, according to one embodiment.
Figure 4:
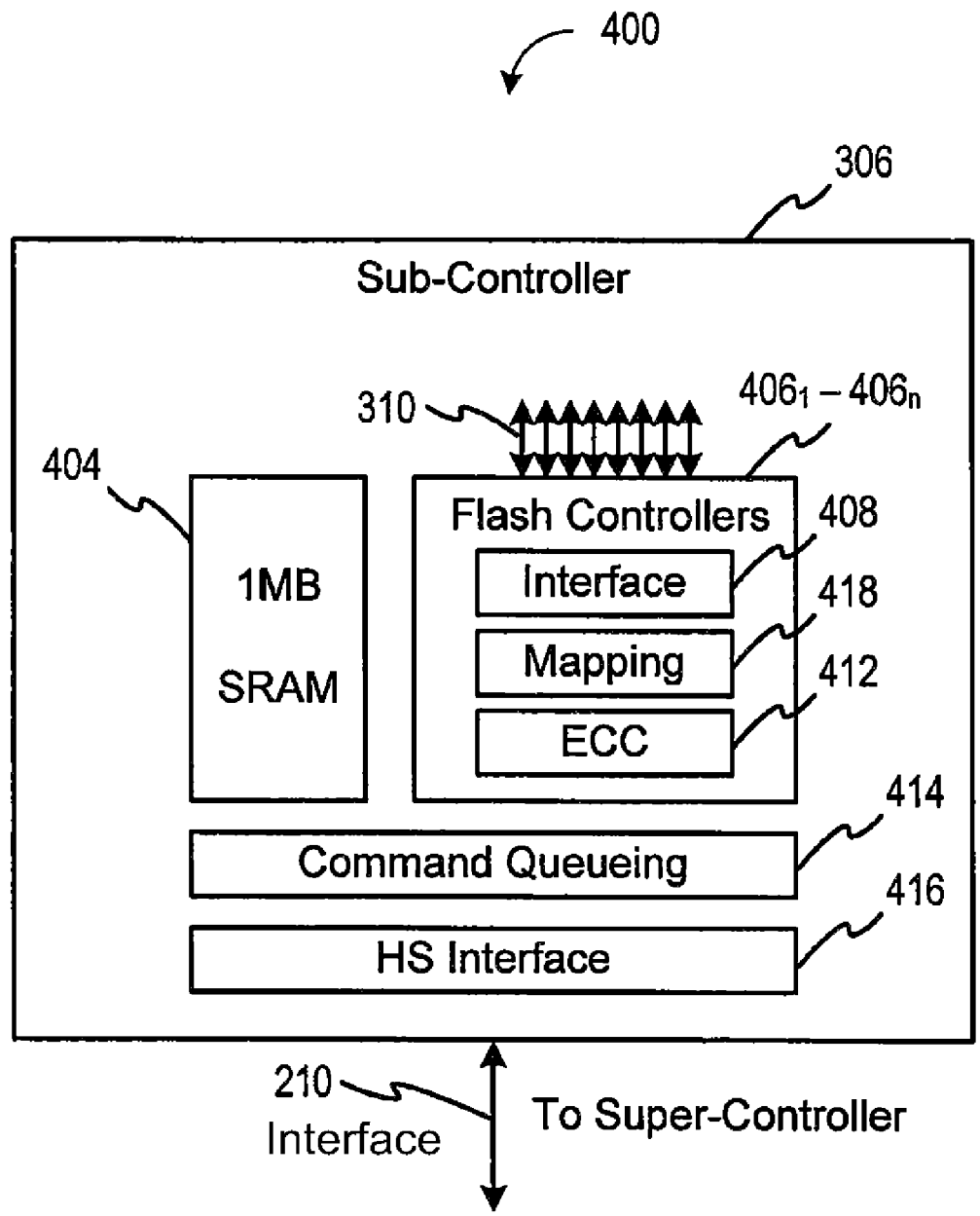
FIG. 4 shows the Sub-Controller, according to one embodiment.

FIGS. 2 through 4 illustrate various implementations of the Super-Stack 102, the Sub-Stack 122, and the Sub-Controller 126.

FIG. 2 shows a HybridDIMM Super-Stack 200 with multiple Sub-Stacks, according to one embodiment. The Hybrid-DIMM Super-Stack 200 shown in FIG. 2 comprises at least one Sub-Stack 204 including the slow memory and at least one Super-Controller 206. The HybridDIMM Super-Stack 200 shown in FIG. 2 may also comprise optional Sub-Stacks $202_1$-$202_n$ including the slow memory. Interfaces 210 between the Sub-Stack 204 (and/or the Sub-Stacks $202_1$-$202_n$) and the Super-Controller 206 may be an industry-standard flash-memory interface (e.g. NAND, NOR, etc.) and/or they may be a flash memory interface designed for flash-memory subsystems (e.g. OneNAND, ONFI, etc.). The embodiment shown includes the Super-Controller 206 that communicates over the interface 112 (as shown in FIG. 1B) to the memory controller of the host computer, using a standard memory interface (such as DDR3).

The Super-Controller 206 in FIG. 2 operates to provide error-detection and management of the interfaces 210 and 112, as well as management of the Sub-Stack 204, $202_1$-$202_n$ (also referred to herein as Sub-Stack components 204, $202_1$-$202_n$). The Super-Stack interface 112 appears as if Super-Stack 200 was a standard memory component. In a preferred embodiment, the interface 112 conforms to JEDEC x8 DDR3 standard, however in other embodiments, it could be x4 or x16 DDR3, or could be DDR, DDR2, GDDR, GDDR5 etc. In still other embodiments, the interface 112 could include a serial memory interface such as an FBDIMM interface.

The interfaces 210 in FIG. 2, between the Super-Controller 206 and one or more Sub-Stacks 204, $202_1$-$202_n$, may be variously configured. Note first that in other embodiments the Super-Controller 206 may optionally connect directly to one or more flash memory components 124 illustrated in FIG. 1B (not shown in FIG. 2). In some embodiments that use an optional direct interface to the flash memory components 124, the protocol of interface 210 is one of several standard flash protocols (NAND, NOR, OneNAND, ONFI, etc). Additionally, and strictly as an option, in the case that the interface 210 communicates with Sub-Stacks 204, $202_1$-$202_n$, the interface protocol may still be a standard flash protocol, or any other protocol as may be convenient.

With an understanding of the interfaces 210 and 112 of the Super-Stack 200, it follows to disclose some of the various functions of the Super-Stack 200.

The first internal function of the Super-Controller 206 is performed by a signaling translation unit 212 that translates signals (data, clock, command, and control) from a standard (e.g. DDR3) high-speed parallel (or serial in the case of a protocol such as FB-DIMM) memory channel protocol to one or more typically lower speed and possibly different bus-width protocols. The signaling translation unit 212 may thus also convert between bus widths (FIG. 2 shows a conversion from an m-bit bus to an n-bit bus). The signaling translation unit 212 converts the command, address, control, clock, and data signals from a standard memory bus to corresponding signals on the sub-stack or flash interface(s). The Super-Controller 206 may provide some or all (or none) of the logical functions of a standard DRAM interface to the extent it is "pretending" to be a DRAM on the memory bus. Thus in preferred embodiments, the Super-Controller 206 performs all the required IO characteristics, voltage levels, training, initialization, mode register responses and so on—as described by JEDEC standards. So, for example if the memory interface at 112 is a standard x8 DDR3 SDRAM interface then the Super-Controller memory interface as defined by the signaling translation unit 212 behaves as described by the JEDEC DDR3 DRAM standard.

A second internal function of the Super-Controller 206 is performed by protocol logic 216 that converts from one protocol (such as DDR3, corresponding to a fast memory protocol) to another (such as ONFI, corresponding to a slow memory protocol).

A third internal function of the Super-Controller 206 is performed by MUX/Interleave logic 214 that provides a MUX/DEMUX and/or memory interleave from a single memory interface to one or more Sub-Stacks 204, $202_1$-$202_n$, or alternatively (not shown in FIG. 2) directly to one or more flash memory components 124. The MUX/Interleave logic 214 is necessary to match the speed of the slow memory 104 (flash) to the fast memory 106 (DRAM).

FIG. 3 shows a Sub-Stack 302 including a Sub-Controller 306, according to one embodiment. As shown in FIG. 3, the Sub-Stack 302 includes the Sub-Controller 306 and a collection of NAND flash memory components 308, $304_1$-$304_n$. The interface 210 between the Sub-Stack 302 and the Super-Controller, such as the Super-Controller 206 or 116, has already been described in the context of FIG. 2. Interfaces 310 between the Sub-Controller 306 and the flash memory components 308, $304_1$-$304_n$ are standard flash interfaces. The interfaces 310 are defined by the flash memory components 308, $304_1$-$304_n$ that are used to build the Sub-Stack 302.

The flash memory components 308, $304_1$-$304_n$ are organized into an array or stacked vertically in a package using wire-bonded connections (alternatively through-silicon vias or some other connection technique or technology may be used). The Sub-Stack 302 shown as an example in FIG. 3 has 8 active flash memory components $304_1$-$304_n$ plus a spare flash memory component 308, resulting in an array or stack of 9 flash memory components 308, $304_1$-$304_n$. The spare flash memory component 308 is included to increase the yield of the Sub-Stack 302 during assembly. The capacity of the flash memory in the Sub-Stack 302 in aggregate (exclusive of any spare capacity) is any arbitrary size (e.g. 8 gigabit, 16 gigabit, 32 gigabit, etc), and prophetic configurations are envisioned to be arbitrarily larger, bounded only by the practical limits of the availability of the flash memory components 308, $304_1$-$304_n$. Thus, for example, the total flash capacity on a Hybrid-DIMM with 9 Super-Stacks (eight data and one for ECC) with four Sub-Stacks each containing eight 8-gigabit flash chips would be 32 gigabytes. Of course any known or derivative technology for flash may be used, including SLC, MLC, etc.

FIG. 4 shows the Sub-Controller 306, according to one embodiment. The Sub-Controller 306 contains (physically or virtually) as many flash controllers $406_1$-$406_n$ as there are flash memory components 308, $304_1$-$304_n$ in the Sub-Stack 302, the fast memory 404, plus (optionally) additional components to provide interfacing features and advanced functions. The optional components include Command Queuing logic 414 and High-Speed Interface logic 416. The interface 210 shown in FIG. 4 between the Sub-Controller and Super-Controller has already been described in the context of both FIG. 2 and FIG. 3. The interface 310 between the flash controllers and the flash chips was described in the context of FIG. 3.

It should be noted that each flash controller 406 in FIG. 4 may be a single block implementing one or more flash controllers, or it may be a collection of flash controllers, one each dedicated to controlling a corresponding flash memory device.

The High-Speed Interface logic 416 is configured to convert from a high-speed interface capable of handling the aggregate traffic from all of the flash memory components 308, $304_1$-$304_n$ in the Sub-Stack 302 to a lower speed interface used by the flash controllers and each individual flash memory component 308, $304_1$-$304_n$.

The Command Queuing logic 414 is configured to queue, order, interleave and MUX the data from both the fast memory 404 and array of slow flash memory components 308, $304_1$-$304_n$.

Each flash controller 406 contains an Interface unit 408, a Mapping unit 418, as well as ECC (or error correction) unit 412. The Interface unit 408 handles the I/O to the flash components in the Sub-Stack 302, using the correct command, control and data signals with the correct voltage and protocol. The ECC unit 412 corrects for errors that may occur in the flash memory in addition to other well-known housekeeping functions typically associated with flash memory (such as bad-block management, wear leveling, and so on). It should be noted that one or more of these housekeeping functions associated with the use of various kinds of slow memory such as flash may be performed on the host computer instead of being integrated in the flash controller. The functionality of the Mapping unit 418 will be described in much more detail shortly and is the key to being able to access, address and handle the slow flash memory and help make it appear to the outside world as fast memory operating on a fast memory bus.

Figure 5:
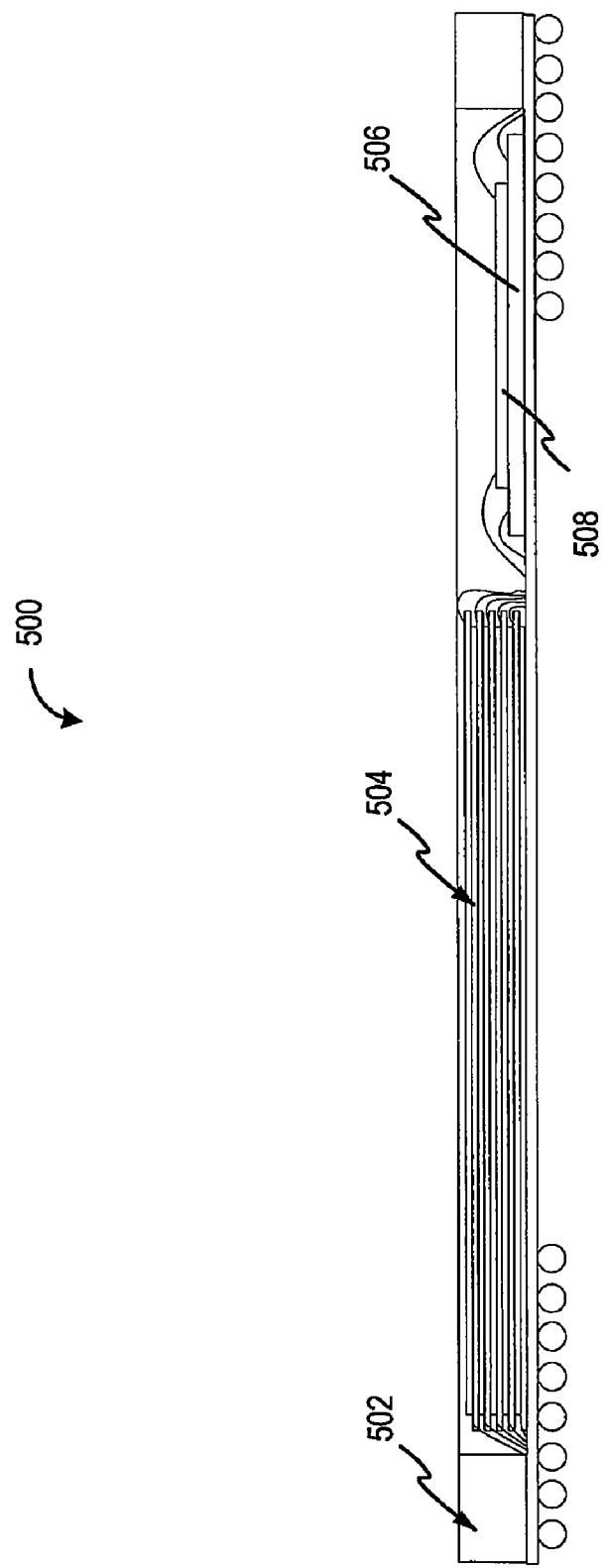
FIG. 5 depicts a physical implementation of a 1-high Super Stack, according to one embodiment.

FIG. 5 depicts a cross-sectional view of one possible physical implementation of a 1-high Super-Stack 502, according to one embodiment. In this embodiment, the Super-Stack 502 is organized as two vertical stacks of chips. A first vertical stack comprising a Super-Controller 506 and a Sub-Controller 508 situated on one end of a multi-chip package (MCP) substrate, and a second vertical Sub-Stack 504 comprises a plurality of flash memory components. The stacks in FIG. 5 show connections between flash memory components made using wire bonds. This is a typical and well-known assembly technique for stacked chips. Other techniques such as through-silicon vias or other chip-stacking techniques may be used. In addition there is no requirement to stack the Super-Controller 506 and Sub-Controller 508 separately from the flash memory components.

Figure 6A:
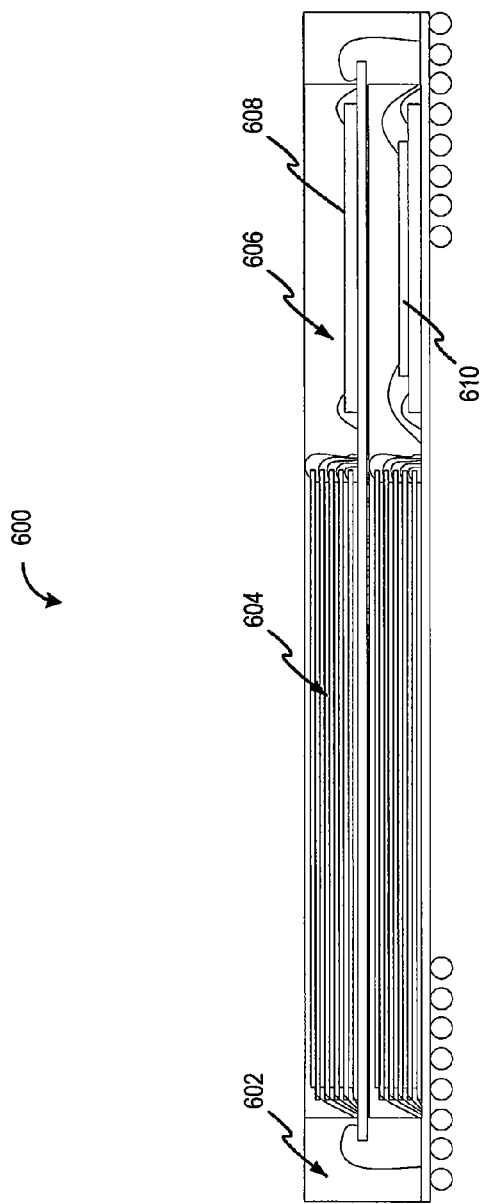
FIG. 6A depicts a physical implementation of 2-high Super-Stacks, according to one embodiment.

FIG. 6A depicts a physical implementation of 2-high Super-Stack 602, according to one embodiment. This implementation is called "2-high" because it essentially takes the 1-high Super-Stack shown in FIG. 5 and duplicates it. In FIG. 6A, element 604 comprise the flash chips, element 608 is a Sub-Controller, and element 610 is a Super-Controller.

Figure 6B:
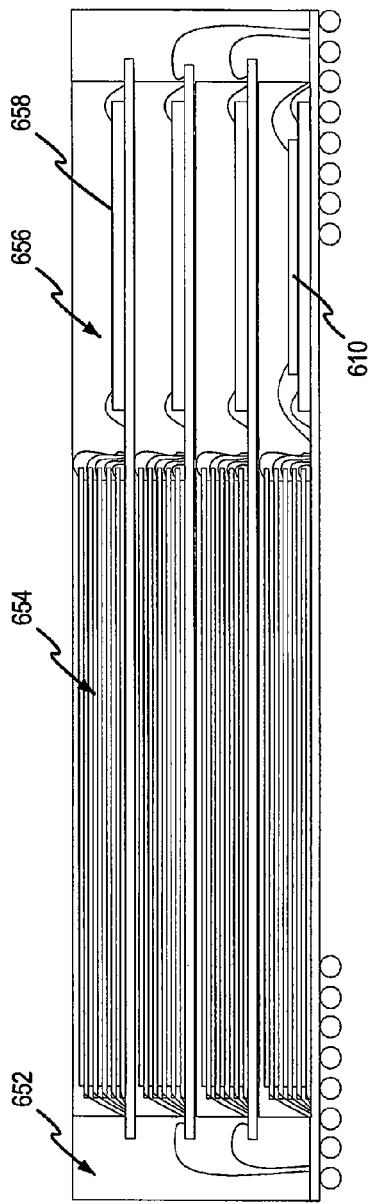
FIG. 6B depicts a physical implementation of a 4-high Super-Stack, according to one embodiment.

FIG. 6B depicts a physical implementation of 4-high Super-Stack 652, according to one embodiment. In FIG. 6B, element 654 comprise the flash chips, element 658 is a Sub-Controller, and element 610 is a Super-Controller.

Having described the high-level view and functions of the HybridDIMM 100 as well as the details of one particular example implementation we can return to FIG. 1A in order to explain the operation of the HybridDIMM 100. One skilled in the art will recognize that the slow memory 104 (discussed above in embodiments using non-volatile memory) can be implemented using any type of memory—including SRAM or DRAM or any other type of volatile or nonvolatile memory. In such as case the fast memory 106 acting as a latency-hiding buffer may emulate a DRAM, in particular a DDR3 SDRAM, and thus present over the host interface 110 according to any one (or more) standards, such as a JEDEC-compliant (or JEDEC-compatible) DDR3 SDRAM interface.

Now that the concept of emulation as implemented in embodiments of a HybridDIMM has been disclosed, we may now turn to a collection of constituent features, including advanced paging and advanced caching techniques. These techniques are the key to allowing the HybridDIMM 100 to appear to be a standard DIMM or to emulate a standard DIMM. These techniques use the existing memory management software and hardware of the host computer to enable two important things: first, to allow the computer to address a very large HybridDIMM 100, and, second, to allow the computer to read and write to the slow memory 104 indirectly as if the access were to the fast memory 106. Although the use and programming of the host computer memory management system described here employs one particular technique, the method is general in that any programming and use of the host computer that results in the same behavior is possible. Indeed because the programming of a host computer system is very flexible, one of the most powerful elements of the ideas described here is that it affords a wide range of implementations in both hardware and software. Such flexibility is both useful in itself and allows implementation on a wide range of hardware (different CPUs for example) and a wide range of operating systems (Microsoft Windows, Linux, Solaris, etc.).

In particular, embodiments of this invention include a host-based paging system whereby a paging system allows access to the mixed-technology memory module 100, a paging system is modified to allow access to the mixed-technology memory module 100 with different latencies, and modifications to a paging system that permits access to a larger memory space than the paging system would normally allow.

Again considering the fast memory 106, embodiments of this invention include a caching system whereby the Hybrid DIMM 100 alters the caching and memory access process.

For example, in one embodiment of the HybridDIMM 100 the well-known Translation Lookaside Buffer (TLB) and/or Page Table functions can be modified to accommodate a mixed-technology DIMM. In this case an Operating System (OS) of the host computer treats main memory on a module as if it were comprised of two types of memory or two classes of memory (and in general more than one type or class of memory). In our HybridDIMM implementation example, the first memory type corresponds to fast memory or standard DRAM and the second memory type corresponds to slow memory or flash. By including references in the TLB (the references may be variables, pointers or other forms of table entries) to both types of memory different methods (or routines) may be taken according to the reference type. If the TLB reference type shows that the memory access is to fast memory, this indicates that the required data is held in the fast memory (SRAM, DRAM, embedded DRAM, etc.) of the HybridDIMM (the fast memory appears to the host as if it were DRAM). In this case a read command is immediately sent to the HybridDIMM and the data is read from SRAM (as if it were normal DRAM). If the TLB shows that the memory access is to slow memory, this indicates that the required data is held in the slow memory (flash etc.) of the HybridDIMM. In this case a copy command is immediately sent to the HybridDIMM and the data is copied from flash (slow memory) to SRAM (fast memory). The translation between host address and HybridDIMM address is performed by the combination of the normal operation of the host memory management and the mapper logic function on the HybridDIMM using well-known and existing techniques. The host then waits for the copy to complete and issues a read command to the HybridDIMM and the copied data is read from SRAM (again now as if it were normal DRAM).

Having explained the general approach, various embodiments of such techniques, methods (or routines) are presented in further detail below. In order to offer consistency in usage of terms, definitions are provided here, as follows:
va—virtual address that caused the page fault
sp—SRAM page selected in Step 1
pa—a physical address
Page Table and Mapper requirements:
PageTable[va]=pa
Mapper[pa]=sp
Hence: Mapper[PageTable[va]]=sp
How do we select a physical address "pa"?
Must not already map to an active SRAM location
Must map to the BigDIMM that contains the "sp"
The caches must not contain stale data with "pa" physical tags
No processor in the coherence domain must contain a stale TLB entry for "va"

Figure 7:
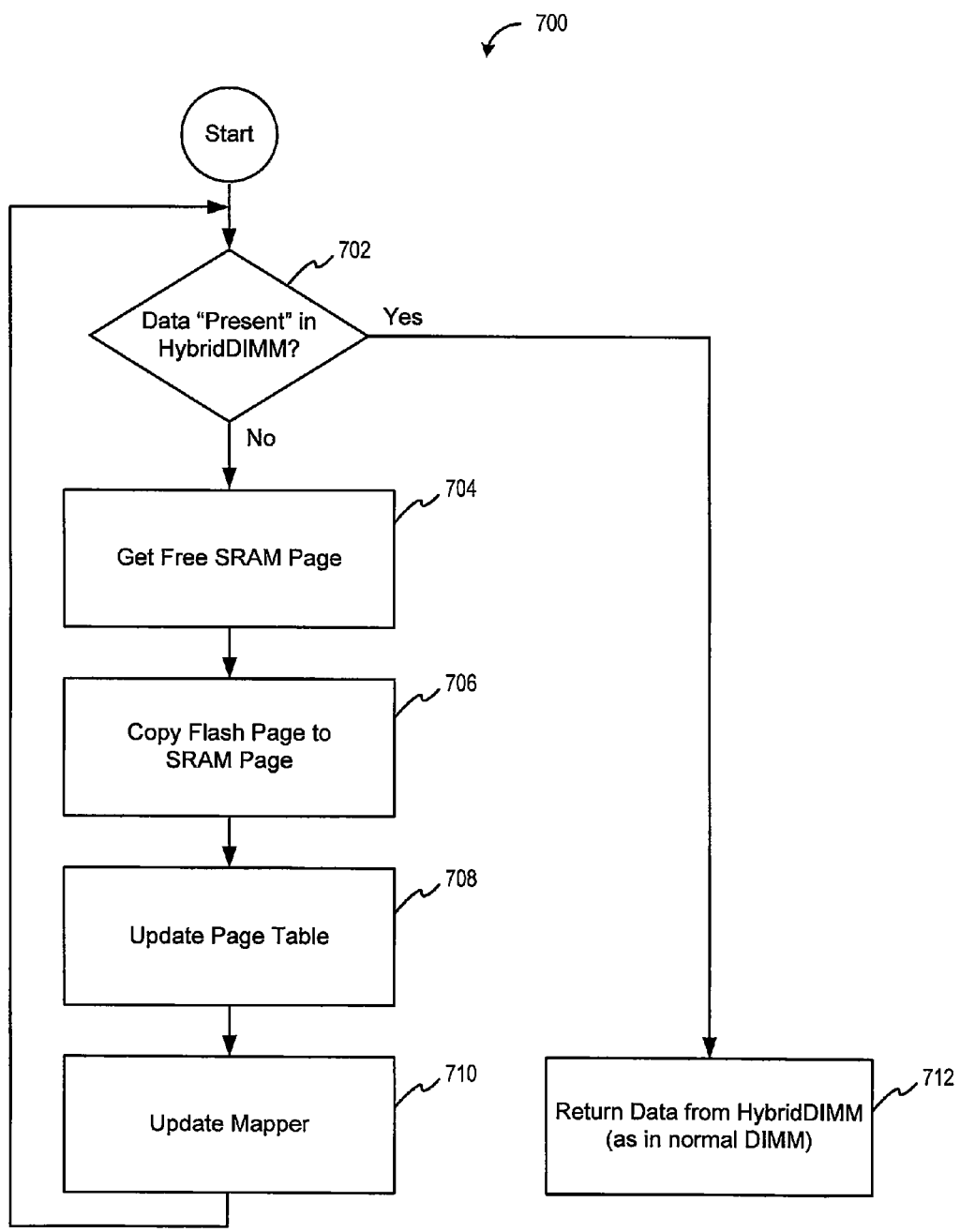
FIG. 7 shows a method of retrieving data from a Hybrid-DIMM, according to one embodiment.
Figure 8A:
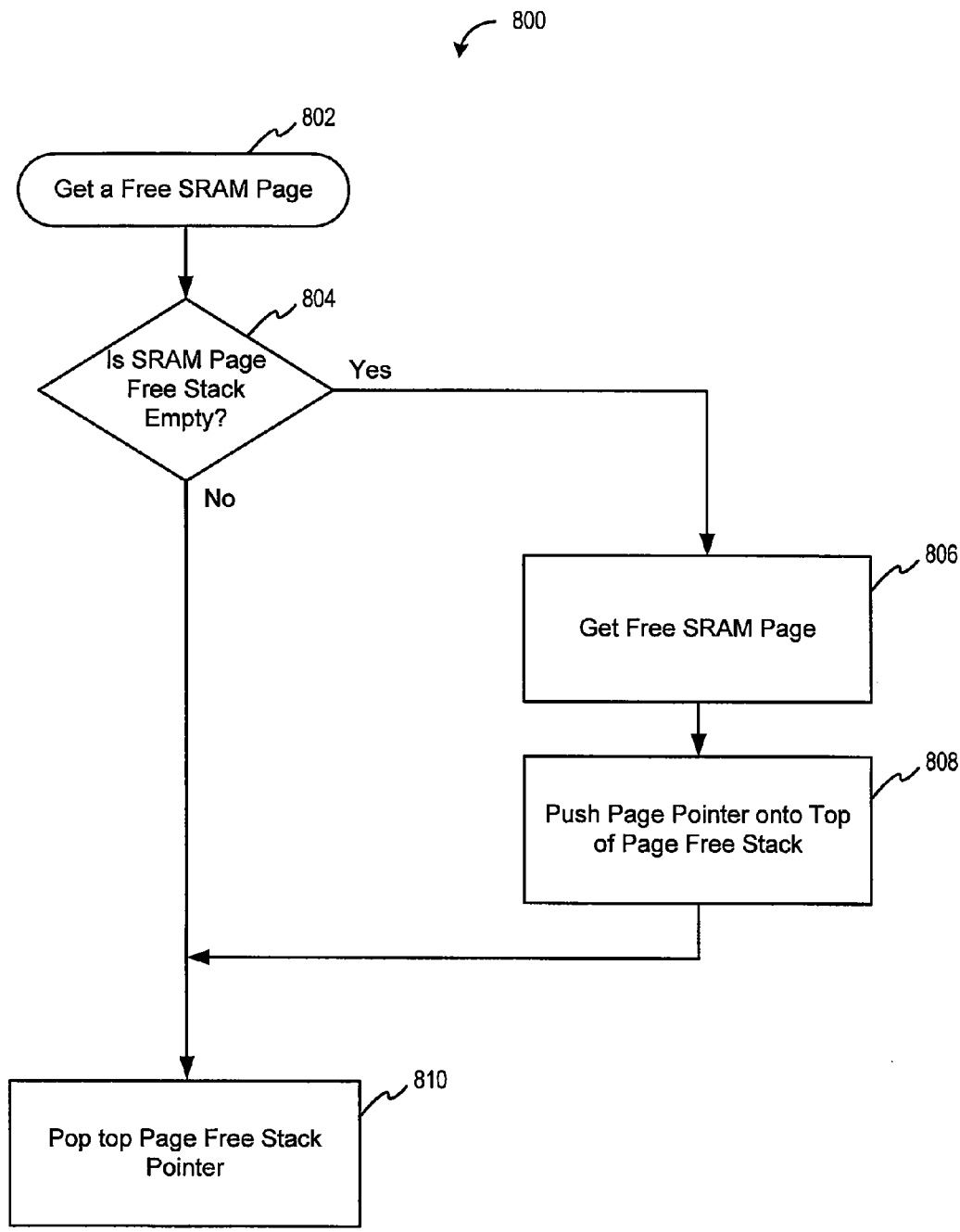
FIG. 8A shows a method of managing SRAM pages on a HybridDIMM, according to one embodiment.
Figure 8B:
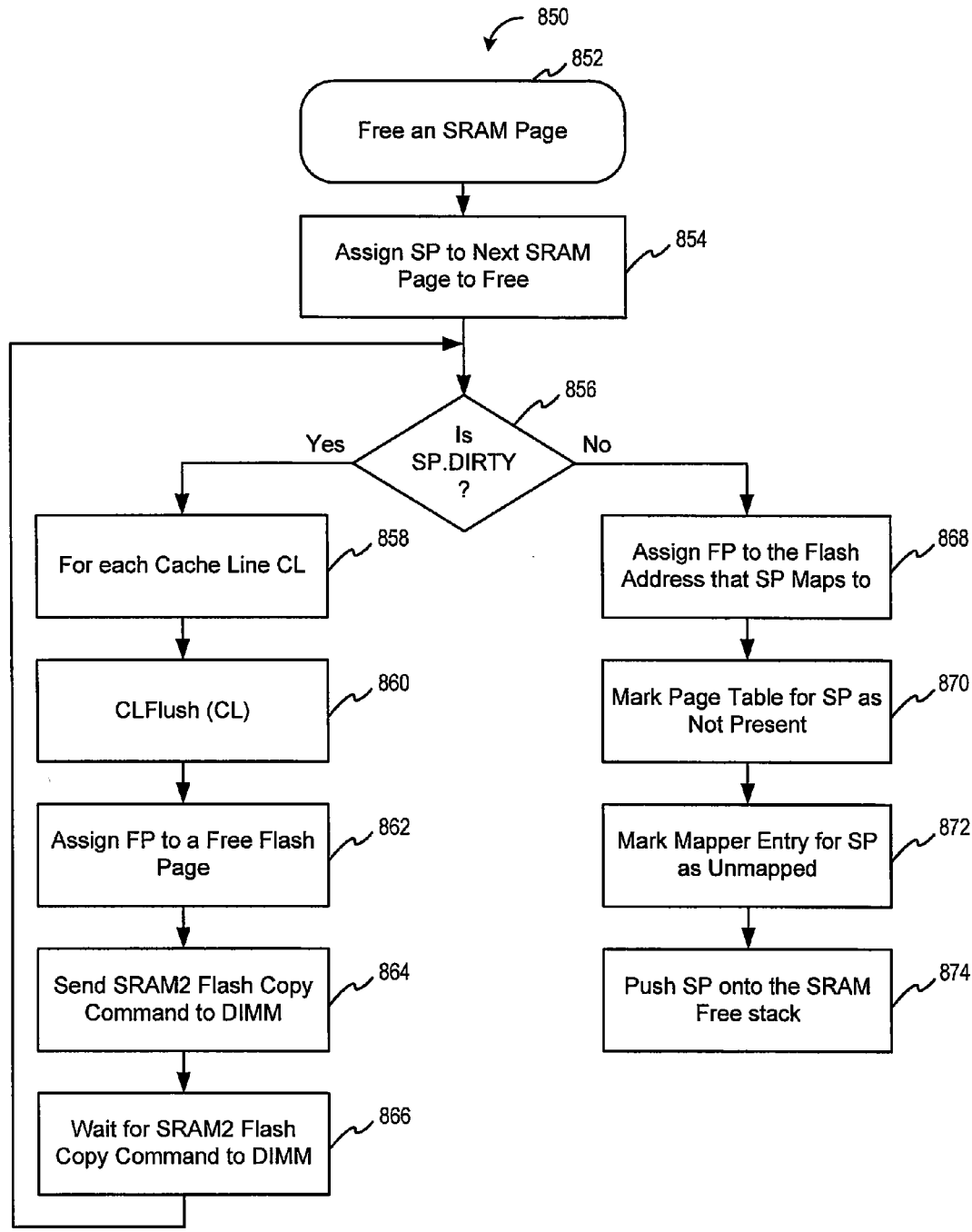
FIG. 8B shows a method of freeing SRAM pages on a HybridDIMM, according to one embodiment.
Figure 9:
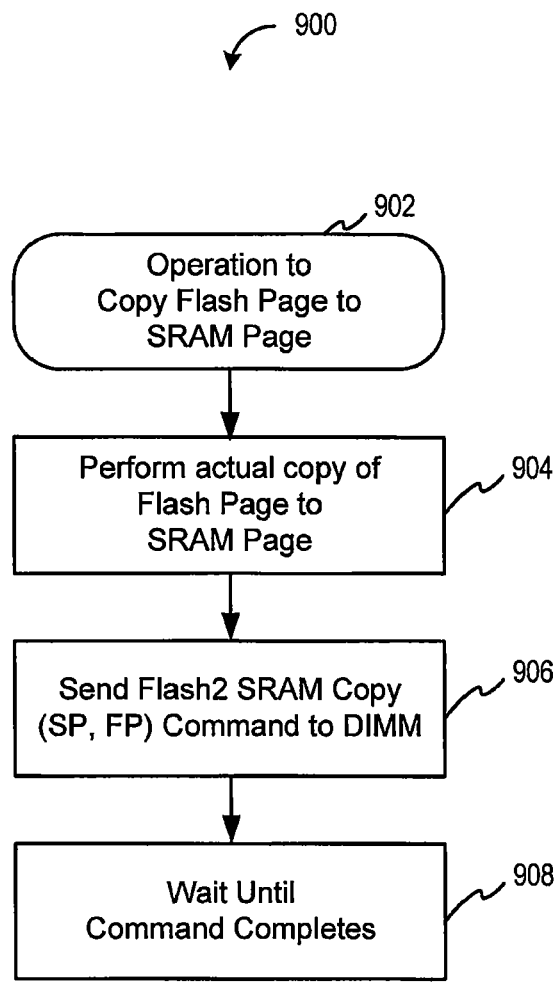
FIG. 9 shows a method of copying a flash page to an SRAM page on a HybridDIMM, according to one embodiment.

FIGS. 7 through 9 illustrate interactions between the OS of the host computer and the mixed-technology memory module 100 from the perspective of the OS. Although the method steps of FIGS. 7-9 are described with respect to the memory management portion of the computer OS, any elements or combination of elements within the OS and/or computer configured to perform the method steps, in any order, falls within the scope of the present invention.

FIG. 7 shows a method 700 for returning data resident on the HybridDIMM to the memory controller. As an option, the present method 700 may be implemented in the context of the architecture and functionality of FIG. 1 through FIG. 6. Of course, however, the method 700 or any operation therein may be carried out in any desired environment.

The method 700 as described herein may be entered as a result of a request from the memory controller for some data resident on a HybridDIMM. The operation underlying decision 702 may find the data is "Present" on the HybridDIMM (it is standard and well-known that an OS uses the terms "Present" and "Not Present" in its page tables). The term "Present" means that the data is being held in the fast memory on a HybridDIMM. To the OS it is as if the data is being held in standard DRAM memory, though the actual fast memory on the HybridDIMM may be SRAM, DRAM, embedded DRAM, etc. as we have already described. In the example here we shall use fast memory and SRAM interchangeably and we shall use slow memory and flash memory interchangeably. If the data is present then the BigDIMM returns the requested data as in a normal read operation (operation 712) to satisfy the request from the memory controller. Alternatively, if the requested data is "Not Present" in fast memory, the OS must then retrieve the data from slow memory. Of course retrieval from slow memory may include various housekeeping and management (as already has been described for flash memory, for example). More specifically, in the case that the requested data is not present in fast memory, the OS allocates a free page of fast memory (operation 704) to serve as a repository, and possibly a latency-hiding buffer for the page containing the requested data. Once the OS allocates a page of fast memory, the OS then copies at least one page of memory from slow memory to fast memory (operation 706). The OS records the success of the operation 706 in the page table (see operation 708). The OS then records the range of addresses now present in fast memory in the mapper (see operation 710). Now that the initially requested data is present in fast memory, the OS restarts the initially memory access operation from the point of decision 702.

To make the operations required even more clear the following pseudo-code describes the steps to be taken in an alternative but equivalent fashion:
A. If Data is "Present" (e.g. present in memory type DRAM) in the HybridDIMM:
 The HybridDIMM SRAM behaves the same as standard DRAM
B. Data "Not Present" (e.g. present in memory type Flash)—there is a HybridDIMM Page Fault:
 1. Get free SRAM page
 2. Copy flash page to SRAM page
 3. Update Page Table and/or TLB
 4. Update Mapper
 5. Restart Read/Write (Load/Store)

We will describe the steps taken in method or code branch B above in more detail presently. First, we must describe the solution to a problem that arises in addressing or accessing the large HybridDIMM. In order to access the large memory space that is made possible by using a HybridDIMM (which may be as much as several terabytes), the host OS may also modify the use of well-known page-table structures. Thus for example, a 256 terabyte virtual address space (a typical limit for current CPUs because of address-length limitations) may be mapped to pages of a HybridDIMM using the combination of an OS page table and a mapper on the HybridDIMM. The OS page table may map the HybridDIMM pages in groups of 8. Thus entries in the OS page table correspond to Hybrd-DIMM pages (or frames) 0-7, 8-15, 16-23 etc. Each entry in the OS page table points to a 32 kilobyte page (or frame), that is either in SRAM or in flash on the HybridDIMM. The mapping to the HybridDIMM space is then performed through a 32 GB aperture (a typical limit for current memory controllers that may only address 32 GB per DIMM). In this case a 128-megabyte SRAM on the HybridDIMM contains 4096 pages that are each 32 kilobyte in size. A 2-terabyte flash memory (using 8-, 16-, or 32-gigabit flash memory chips) on the HybridDIMM also contains pages that are 32 kilobyte (made up from 8 flash chips with 4 kilobyte per flash chip).

The technique of using an aperture, mapper, and table in combination is well-known and similar to, for example, Accelerated Graphics Port (AGP) graphics applications using an AGP Aperture and a Graphics Address Relocation Table (GART).

Now the first four steps of method or code branch B above will be described in more detail, first using pseudo-code and then using a flow diagram and accompanying descriptions:

```
Step 1 - Get a free SRAM page
Get free SRAM page( )
    if SRAM page free list is empty( ) then
        Free an SRAM page;
    Pop top element from SRAM page free list
Free an SRAM page:
    sp = next SRAM page to free; // depending on
    chosen replacement policy
    if sp is dirty then
    foreach cache line CL in sp do // ensure
    SRAM contains last written data;
            // could instead also set caches to write-
through
        CLFlush(CL); //<10 µs per 32 KB
    fp = Get free flash page; // wear leveling, etc. is perfomed here
    Send SRAM2flashCpy(sp, fp) command to DIMM;
    Wait until copy completes;
    else
    fp = flash address that sp maps to;
    Page Table [virtual address(sp)] = "not present", fp;
    // In MP environment must handle multiple TLBs
    using additional code here
    Mapper[sp] = "unmapped"
    Push sp on SRAM page free list
    Step 2 - Copy flash page to SRAM
    Copy flash page to SRAM page:
    Send flash2SRAMCpy(sp, fp) command to DIMM;
    Wait until copy completes;
    Step 3 - Update Page Table
Update Page Table:
// Use a bit-vector and rotate through the
vector-cycling from 0 GB up to the 32 GB
aperture and then roll around to 0 GB, re-using
physical addresses
    pa = next unused physical page;
if (pa == 0) then
    WBINVD; // we have rolled around so flush
    and invalidate the entire cache
PageTable[va] = pa;
```

Now we shall describe the key elements of these steps in the pseudo-code above using flow diagrams and accompanying descriptions. FIG. 8A shows a method 800 for the OS to obtain a free page of fast memory ("Get free SRAM page" in the above pseudo-code). Remember we are using fast memory and SRAM interchangeably for this particular example implementation. As an option, the present method 800 may be implemented in the context of the architecture and functionality of FIG. 1 through FIG. 7. Of course, however, the method 800 or any operation therein may be carried out in any desired environment.

The operation 704 from FIG. 7 indicates an operation for the OS to get a page of fast memory. Although many embodiments are possible and conceived, one such operation is disclosed here, namely the method 800. That is, the method 800 is entered at entry point 802 whenever a new page of fast memory is needed. The decision 804 checks for a ready and available page from the page free stack. If there is such an available page, the OS pops that page from the page free stack and returns it in operation 810. Alternatively, if the free stack is empty then the decision 804 will proceed to operation 806. Operation 806 serves to acquire a free fast memory page, whether acquired from a pool or reused resources or whether from a newly allocated page. Once acquired then, the OS pushes the pointer to that page onto the page free stack and the processing proceeds to operation 810, returning the free fast memory page as is the intended result to the method 800.

FIG. 8B shows a method 850 for the OS to free a page of fast memory ("Free an SRAM page" in the above pseudo-code). As an option, the present method 850 may be implemented in the context of the architecture and functionality of FIG. 1 through FIG. 8A. Of course, however, the method 850 or any operation therein may be carried out in any desired environment.

The operation 806 from FIG. 8A indicates an operation for the OS to free a page of fast memory. Although many embodiments are possible and conceived, one embodiment of such an operation is disclosed here, namely the method 850. That is, the method 850 is operable to free a page of fast memory, while maintaining the fidelity of any data that may had previously been written to the page.

As shown, the system is entered when a page of fast memory is required. In general, a free fast memory page could be a page that had previously been allocated, used and subsequently freed, or may be a page that has been allocated and is in use at the moment that the method 850 is executed. The decision 856 operates on a pointer pointing to the next fast memory page to free (from operation 854) to determine if the page is immediately ready to be freed (and re-used) or if the page is in use and contains data that must be retained in slow memory (a "dirty" page). In the latter case, a sequence of operations may be performed in the order shown such that data integrity is maintained. That is, for each cache line CL (operation 858), the OS flushes the cache line (operation 860), the OS assigns a working pointer FP to point to a free slow memory page (see operation 862), the OS writes the 'Dirty' fast memory page to slow memory (operation 864), and the loop continues once the operation 864 completes.

In the alternative (see decision 856), if the page is immediately ready to be freed (and re-used), then the OS assigns the working pointer FP to point to a slow memory address that SP maps to (operation 868). Of course since the corresponding page will now be reused for cache storage of new data, the page table must be updated accordingly to reflect that the previously cached address range is (or will soon be) no longer available in cache (operation 870). Similarly, the OS records the status indicating that address range is (or will soon be) not mapped (see operation 872). Now, the page of fast memory is free, the data previously cached in that page (if any) has been written to slow memory, and the mapping status has been marked; thus the method 850 pushes the pointer to the page of fast memory onto the page free stack.

FIG. 9 shows a method 900 copying a page of slow memory to a page of fast memory. As an option, the present method 900 may be implemented in the context of the architecture and functionality of FIG. 1 through FIG. 8B. Of course, however, the method 900 or any operation therein may be carried out in any desired environment.

The operation 706 from FIG. 7 indicates an operation to copy page of slow memory to a page of fast memory. In the embodiment shown, the OS is operable to not only perform the actually copy, but also to perform bookkeeping and synchronization. In particular, after the actual copy is performed (operation 904) the OS sends the fact that this copy has been performed to the HybridDIMM (operation 906) and the method 900 waits (operation 908) until completion of operation 906 is signaled.

These methods and steps are described in detail only to illustrate one possible approach to constructing a host OS and memory subsystem that uses mixed-technology memory modules.

While the foregoing is directed to embodiments of the present invention, other and further embodiments of the present invention may be devised without departing from the basic scope thereof, and the scope thereof is determined by the claims that follow.

We claim:

1. A hybrid memory module, comprising:
   a plurality of super-stacks; and
   a host interface configured to transmit data between the plurality of super-stacks and a memory controller,
   wherein each super-stack includes:
     a respective plurality of sub-stacks, each of the sub-stacks including: a respective sub-controller, a plurality of memory devices of a first memory type and a memory device of a second memory type,
     a respective super-controller configured to control the plurality of sub-stacks, and
     a respective super-stack interface configured to transmit data between the plurality of sub-stacks and the host interface.

2. The hybrid memory module of claim 1, wherein each respective sub-controller is configured to control the plurality of memory devices of the first memory type, and wherein each sub-stack further includes:
   a respective interface configured to transmit data between the sub-controller and the super-controller.

3. The hybrid memory module of claim 2, wherein each sub-controller includes:
   the respective memory device of the second memory type;
   a respective plurality of flash controllers configured to provide interface, mapping, error detection, or error correction functionality to the plurality of memory devices of the first memory type; and
   a respective flash interface configured to transmit data between the plurality of flash controllers and the plurality of memory devices of the first memory type.

4. The hybrid memory module of claim 3, wherein:
   the number of flash controllers within the plurality of flash controllers is equal to the number of memory devices within the plurality of memory devices of the first memory type, and
   each flash controller provides interface, mapping, error detection, and error correction functionality to only one of the plurality of the memory devices of the first memory type.

5. The hybrid memory module of claim 3, wherein the plurality of flash controllers are implemented in a single block.

6. The hybrid memory module of claim 3, wherein the sub-controller further includes command queuing logic configured to:
   receive first data from the plurality of memory devices of the first memory type and the memory device of the second memory type;
   multiplex the first data to produce multiplexed data; and
   transmit the multiplexed data to the super-controller via the interface.

7. The hybrid memory module of claim 6, wherein the command queuing logic is further configured to:
   receive second data from the super-controller via the interface;
   demultiplex the received second data to produce demultiplexed data; and
   transmit the demultiplexed data to at least one of the plurality of memory devices of the first memory type via the flash interface and the memory device of the second memory type.

8. The hybrid memory module of claim 3, wherein the sub-controller further includes high-speed interface logic configured to convert the data communicated via the interface to the data communicated via the flash interface.

9. The hybrid memory module of claim 3, wherein the super-controller includes a signaling translation unit configured to translate data, clock, command, and control signals from a first memory channel protocol having a first signaling speed to a second memory channel protocol having a second signaling speed, the second signaling speed being different from the first signaling speed.

10. The hybrid memory module of claim 3, wherein the super-controller includes protocol logic configured to convert a first protocol used to transmit data via the interface to a second protocol.

11. The hybrid memory module of claim 3, wherein the super-controller includes logic configured to match the speed of each memory device of the first memory type with the speed of the memory device of the second memory type.

12. The hybrid memory module of claim 3, wherein the first memory type comprises non-volatile memory.

13. The hybrid memory module of claim 12, wherein the non-volatile memory comprises NAND flash memory.

14. The hybrid memory module of claim 12, wherein the sub-stack includes a spare device.

15. The hybrid memory module of claim 3, wherein the second memory type comprises volatile memory.

16. The hybrid memory module of claim 15, wherein the volatile memory comprises Static Random Access Memory (SRAM) memory.

17. The hybrid memory module of claim 1, wherein the hybrid memory module comprises a dual inline memory module (DIMM).

18. The hybrid memory module of claim 1, wherein the hybrid memory module is part of a memory subsystem.

19. The hybrid memory module of claim 1, wherein the hybrid memory module is coupled to a motherboard.

20. The hybrid memory module of claim 1, wherein the hybrid memory module is included in a computer system.

21. A hybrid memory module, comprising:
   a plurality of super-stacks; and
   a host interface configured to transmit data between the plurality of super-stacks and a memory controller,
   wherein each super-stack includes:
     a plurality of sub-stacks, each of the sub-stacks including:
       a respective plurality of non-volatile memory devices;
       a respective sub-controller configured to control the plurality of non-volatile memory devices, the sub-controller including a volatile memory device; and
       a respective interface configured to transmit data between the sub-controller and a super-controller; and
     the super-controller configured to control the plurality of sub-stacks, and
     a super-stack interface configured to transmit data between the plurality of sub-stacks and the first interface.

22. The hybrid memory module of claim 21, wherein each sub-controller includes:
a respective plurality of flash controllers configured to provide interface, mapping, error detection, or error correction functionality to the plurality of non-volatile memory devices; and
a respective flash interface configured to transmit data between the plurality of flash controllers and the plurality of non-volatile memory devices.

23. The hybrid memory module of claim 22, wherein:
the number of flash controllers within the plurality of flash controllers is equal to the number of non-volatile memory devices within the plurality of non-volatile memory devices, and
each flash controller provides interface, mapping, error detection, and error correction functionality to only one of the plurality of non-volatile memory devices.

24. The hybrid memory module of claim 22, wherein the plurality of flash controllers are implemented in a single block.

25. The hybrid memory module of claim 22, wherein the sub-controller further includes command queuing logic configured to:
receive first data from at least two of the plurality of non-volatile memory devices;
multiplex the first data to produce multiplexed data; and
transmit the multiplexed data to the super-controller via the interface.

26. The hybrid memory module of claim 25, wherein the command queuing logic is further configured to:
receive second data from the super-controller via the interface;
demultiplex the received second data to produce demultiplexed data; and
transmit the demultiplexed data to at least two of the plurality of non-volatile memory devices via the flash interface.

27. The hybrid memory module of claim 22, wherein the sub-controller further includes high-speed interface logic configured to convert the data communicated via the interface to the data communicated via the flash interface.

28. The hybrid memory module of claim 22, wherein the super-controller includes a signaling translation unit configured to translate data, clock, command, and control signals from a first memory channel protocol having a first signaling speed to a second memory channel protocol having a second signaling speed, the second signaling speed being different from the first signaling speed.

29. The hybrid memory module of claim 22, wherein the super-controller includes protocol logic configured to convert a first protocol used to transmit data via the interface to a second protocol.

30. A hybrid memory module, comprising:
a plurality of super-stacks; and
a host interface configured to transmit data between the plurality of super-stacks and a memory controller,
wherein each super-stack includes:
a plurality of sub-stacks, each of the sub-stacks including:
a respective plurality of flash memory devices;
a respective sub-controller configured to control the plurality of flash memory devices, the sub-controller including:
a volatile memory device;
a respective plurality of flash controllers configured to provide interface, mapping, error detection, or error correction functionality to the plurality of flash memory devices, the respective plurality of flash controllers being equal in number to the flash memory devices; and
a respective flash interface configured to transmit data between the plurality of flash controllers and the plurality of flash memory devices;
a respective interface configured to transmit data between the sub-controller and a super-controller; and
the super-controller configured to control the plurality of sub-stacks, and
a super-stack interface configured to transmit data between the plurality of sub-stacks and the host interface.

31. The hybrid memory module of claim 30, wherein the plurality of flash controllers are implemented in a single block.

32. The hybrid memory module of claim 30, wherein the sub-controller further includes command queuing logic configured to:
receive first data from at least two of the plurality of non-volatile memory devices;
multiplex the first data to produce multiplexed data; and
transmit the multiplexed data to the super-controller via the interface.

33. The hybrid memory module of claim 32, wherein the command queuing logic is further configured to:
receive second data from the super-controller via the interface;
demultiplex the received second data to produce demultiplexed data; and
transmit the demultiplexed data to at least two of the plurality of non-volatile memory devices via the flash interface.

34. The hybrid memory module of claim 30, wherein the sub-controller further includes high-speed interface logic configured to convert the data communicated via the interface to the data communicated via the flash interface.

35. The hybrid memory module of claim 30, wherein the super-controller includes a signaling translation unit configured to translate data, clock, command, and control signals from a first memory channel protocol having a first signaling speed to a second memory channel protocol having a second signaling speed, the second signaling speed being different from the first signaling speed.

36. The hybrid memory module of claim 30, wherein the super-controller includes protocol logic configured to convert a first protocol used to transmit data via the interface to a second protocol.

* * * * *

UNITED STATES PATENT AND TRADEMARK OFFICE
CERTIFICATE OF CORRECTION

| | | |
|---|---|---|
| PATENT NO. | : 8,397,013 B1 | Page 1 of 1 |
| APPLICATION NO. | : 12/057306 | |
| DATED | : March 12, 2013 | |
| INVENTOR(S) | : Rosenband et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 630 days.

Signed and Sealed this
Eighteenth Day of November, 2014

Michelle K. Lee
*Deputy Director of the United States Patent and Trademark Office*